(12) United States Patent
Kim et al.

(10) Patent No.: US 11,688,779 B2
(45) Date of Patent: Jun. 27, 2023

(54) SEMICONDUCTOR MEMORY DEVICE AND METHOD FOR MANUFACTURING THE SAME

(71) Applicant: SAMSUNG ELECTRONICS CO., LTD., Suwon-si (KR)

(72) Inventors: Hui-Jung Kim, Seongnam-si (KR); Junhyeok Ahn, Suwon-si (KR); Jae Hyun Yoon, Suwon-si (KR); Myeong-Dong Lee, Seoul (KR); Seok Hwan Lee, Yongin-si (KR); Sunghee Han, Hwaseong-si (KR); Inkyoung Heo, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/387,427

(22) Filed: Jul. 28, 2021

(65) Prior Publication Data

US 2022/0045182 A1 Feb. 10, 2022

(30) Foreign Application Priority Data

Aug. 7, 2020 (KR) .................. 10-2020-0099147

(51) Int. Cl.
*H01L 29/417* (2006.01)
*H01L 29/06* (2006.01)
(Continued)

(52) U.S. Cl.
CPC .... *H01L 29/41775* (2013.01); *H01L 29/0653* (2013.01); *H01L 29/0847* (2013.01);
(Continued)

(58) Field of Classification Search
CPC .......... H01L 29/41775; H01L 29/0653; H01L 29/0847; H01L 27/10814; H01L 27/10855;
(Continued)

(56) References Cited

U.S. PATENT DOCUMENTS 8,410,608 B2  4/2013 Wada et al.
9,431,345 B2  8/2016 Sakata et al.
(Continued)

FOREIGN PATENT DOCUMENTS

KR  10-0843715  7/2008
TW  202021127   6/2020

OTHER PUBLICATIONS

Byun, et al., "Graphene for True Ohmic Contact at Metal-Semiconductor Junctions", Nano Letters, Aug. 26, 2013, 18 pages.
(Continued)

*Primary Examiner* — Sonya McCall-Shepard
(74) *Attorney, Agent, or Firm* — F. Chau & Associates, LLC

(57) ABSTRACT

A semiconductor memory device includes a substrate having a first active pattern including first and second source/drain regions, a gate electrode intersecting the first active pattern and disposed between the first and second source/drain regions, a bit line intersecting the first active pattern and electrically connected to the first source/drain region, a spacer disposed on a sidewall of the bit line, a contact electrically connected to the second source/drain region and spaced apart from the bit line with the spacer interposed therebetween, an interface layer disposed between the second source/drain region and the contact, and forming an ohmic contact between the second source/drain region and the contact, and a data storage element disposed on the contact. A bottom of the contact is lower than a top surface
(Continued)

of the substrate. The contact is formed of a metal, a conductive metal nitride, and/or a combination thereof.

19 Claims, 50 Drawing Sheets

(51) Int. Cl.
*H01L 29/08* (2006.01)
*H01L 29/16* (2006.01)
*H01L 29/45* (2006.01)
*H01L 27/108* (2006.01)

(52) U.S. Cl.
CPC .... *H01L 29/1606* (2013.01); *H01L 27/10814* (2013.01); *H01L 29/45* (2013.01)

(58) Field of Classification Search
CPC ......... H01L 27/10823; H01L 27/10829; H01L 27/1085; H01L 27/10888; H01L 29/45; H01L 23/53276; G11C 5/06–10
See application file for complete search history.

(56) References Cited

U.S. PATENT DOCUMENTS

| | | | |
|---|---|---|---|
| 9,613,854 | B2 | 4/2017 | Yang et al. |
| 9,882,008 | B2 | 1/2018 | Colombo et al. |
| 9,972,537 | B2 | 5/2018 | Jacob |
| 10,134,630 | B2 | 11/2018 | Ham et al. |
| 10,483,115 | B2 | 11/2019 | Chou et al. |
| 10,510,657 | B2 | 12/2019 | Yang et al. |
| 11,177,268 | B2 | 11/2021 | Wu et al. |
| 2008/0284029 | A1 | 11/2008 | Kim et al. |
| 2016/0126246 | A1 | 5/2016 | Lee |
| 2020/0013668 | A1 | 1/2020 | Choi et al. |
| 2020/0328215 | A1* | 10/2020 | Chu .................. H01L 27/10855 |

OTHER PUBLICATIONS

Lee, et al., "Two-dimensional Materials Inserted at the Metal/Semiconductor Interface: Attractive Candidates for Semiconductor Device Contacts", Nano Letters, Jul. 23, 2018, 24 pages.

* cited by examiner

SEMICONDUCTOR MEMORY DEVICE AND METHOD FOR MANUFACTURING THE SAME

CROSS-REFERENCE TO RELATED APPLICATION

This U.S. non-provisional patent application claims priority under 35 U.S.C. § 119 to Korean Patent Application No. 10-2020-0099147, filed on Aug. 7, 2020, in the Korean Intellectual Property Office, the disclosure of which is incorporated by reference herein in its entirety.

TECHNICAL FIELD

The present inventive concept relates to a semiconductor memory device and a method for manufacturing the same, and more particularly, to a semiconductor memory device with enhanced electrical characteristics and a method for manufacturing the same.

DISCUSSION OF RELATED ART

Semiconductor devices are widely used in electronic industry because of their small sizes, multi-functional characteristics, and/or low manufacturing costs. Data storage devices among the semiconductor devices may store logical data. As the data storage devices become highly integrated with the advancement of the electronic industry, widths of elements or components of the data storage devices are being reduced for high integration thereof.

In addition, high reliability of the data storage devices is required with the high integration of the data storage devices. However, the reliability of the data storage devices may be deteriorated by the high integration, for example, a deterioration of electrical characteristics due to the reduction in widths of the elements or the components, and unstable contacts with high contact resistance at interfaces therebetween. Thus, various researches have been carried out to enhance the reliability of the data storage devices.

SUMMARY

Embodiments of the present inventive concept may provide a semiconductor memory device with enhanced electrical characteristics.

Embodiments of the present inventive concept may also provide a method for manufacturing a semiconductor memory device with enhanced electrical characteristics.

In an embodiment of the present inventive concept, a semiconductor memory device may include a substrate having a first active pattern including a first source/drain region and a second source/drain region; a gate electrode intersecting the first active pattern and extending in a first direction, the gate electrode disposed between the first and second source/drain regions when viewed in a plan view; a bit line intersecting the first active pattern and extending in a second direction crossing the first direction, the bit line electrically connected to the first source/drain region; a spacer disposed on a sidewall of the bit line; a contact electrically connected to the second source/drain region, the contact spaced apart from the bit line with the spacer interposed therebetween; an interface layer disposed between the second source/drain region and the contact, the interface layer forming an ohmic contact between the second source/drain region and the contact; and a data storage element disposed on the contact. A bottom of the contact, which is in contact with the interface layer, may be lower than a top surface of the substrate. The contact may be formed of at least one of a metal, a conductive metal nitride, or a combination thereof.

In an embodiment of the present inventive concept, a semiconductor memory device may include a substrate having an active pattern including a first source/drain region and a second source/drain region; a gate electrode intersecting the active pattern and extending in a first direction, the gate electrode disposed between the first and second source/drain regions when viewed in a plan view; a line structure intersecting the active pattern and extending in a second direction crossing the first direction, the line structure comprising a bit line electrically connected to the first source/drain region; a spacer disposed on a sidewall of the line structure; a metal contact electrically connected to the second source/drain region, the metal contact spaced apart from the bit line with the spacer interposed therebetween; an interface layer disposed between the second source/drain region and the metal contact; and a data storage element disposed on the metal contact. The interface layer may include graphene.

In an embodiment of the present inventive concept, a semiconductor memory device may include a substrate having an active pattern, the active pattern, which has a long axis in a first direction, including a first source/drain region and a pair of second source/drain regions spaced apart from each other in the first direction with the first source/drain region interposed therebetween; a device isolation layer filling a first trench which is provided in the substrate to define the active pattern; a pair of gate electrodes intersecting the active pattern and extending in a second direction crossing the first direction, each of the pair of gate electrodes provided in a second trench between the first and second source/drain regions and having a top surface lower than a top surface of the active pattern; a gate dielectric layer disposed between the active pattern and each of the pair of gate electrodes; a gate capping layer provided on each of the pair of gate electrodes to fill the second trench; an insulating layer disposed on the substrate; a line structure intersecting the active pattern on the insulating layer and extending in a third direction crossing the first and second directions, the line structure comprising: a conductive pattern penetrating the insulating layer so as to be connected to the first source/drain region; a bit line disposed on the conductive pattern; and a barrier pattern disposed between the bit line and the conductive pattern; a pair of spacers provided on both sidewalls of the line structure, respectively; a pair of metal contacts electrically connected to the pair of second source/drain regions, respectively, being in contact with the pair of spacers, respectively, and spaced apart from the line structure by the pair of spacers; a pair of interface layers disposed between the pair of second source/drain regions and the pair of metal contacts, respectively; first electrodes disposed on the pair of metal contacts, respectively; a second electrode on the first electrodes; and a dielectric layer disposed between the second electrode and the first electrodes. Each of the pair of second source/drain regions may have a recessed top surface lower than a top surface of the substrate. Each of the pair of interface layers may cover the recessed top surface. Each of the pair of interface layers may form an ohmic contact between each of the pair of second source/drain regions and each of the pair of metal contacts, respectively.

In an embodiment of the present inventive concept, a method for manufacturing a semiconductor memory device may include patterning a substrate to form a first trench defining an active pattern; forming a device isolation layer filling the first trench; forming a gate electrode intersecting the active pattern and extending in a first direction; forming a first source/drain region and a second source/drain region in an upper portion of the active pattern, the first and second source/drain regions adjacent to both sides of the gate electrode, respectively; forming an insulating layer on the active pattern; forming a line structure intersecting the active pattern on the insulating layer and extending in a second direction crossing the first direction, the line structure comprising: a bit line electrically connected to the first source/drain region; and a mask pattern disposed on the bit line; forming a spacer on a sidewall of the line structure; forming a first contact hole penetrating the insulating layer to expose a recessed top surface of the second source/drain region; forming an interface layer covering the recessed top surface of the second source/drain region, the interface layer including graphene; forming a metal contact filling the first contact hole on the interface layer; and forming a data storage element on the metal contact.

BRIEF DESCRIPTION OF THE DRAWINGS

The present inventive concept will become more apparent by describing in detail embodiments thereof in view of the accompanying drawings, in which.

Figure 1:
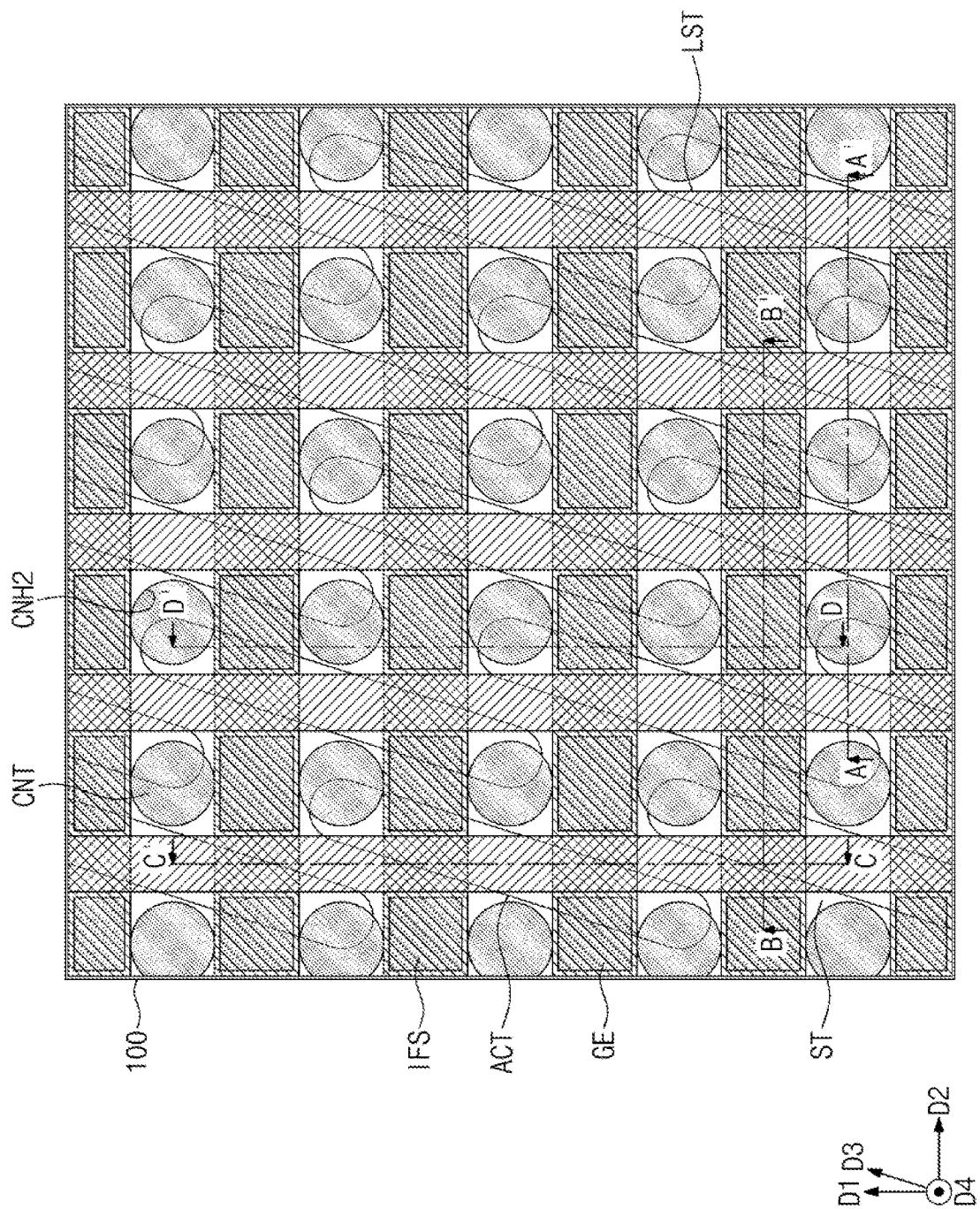
FIG. 1 is a plan view illustrating a semiconductor memory device according to an embodiment of the present inventive concept.

Since the drawings in FIGS. 1-23 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Figure 2A:
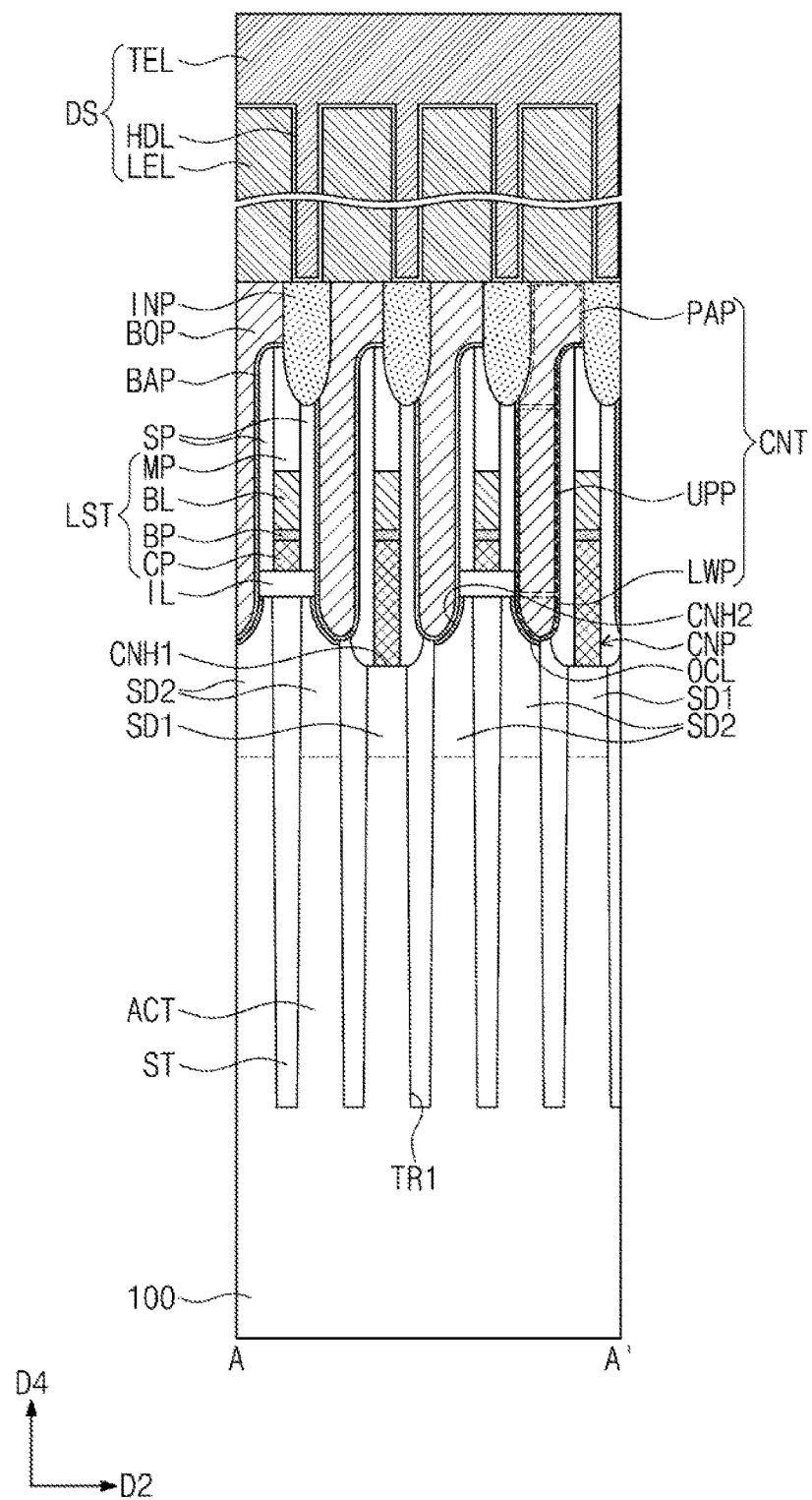
FIGS. 2A, 2B, 2C and 2D are cross-sectional views taken along lines A-A', B-B', C-C' and D-D' of FIG. 1, respectively.
Figure 2B:
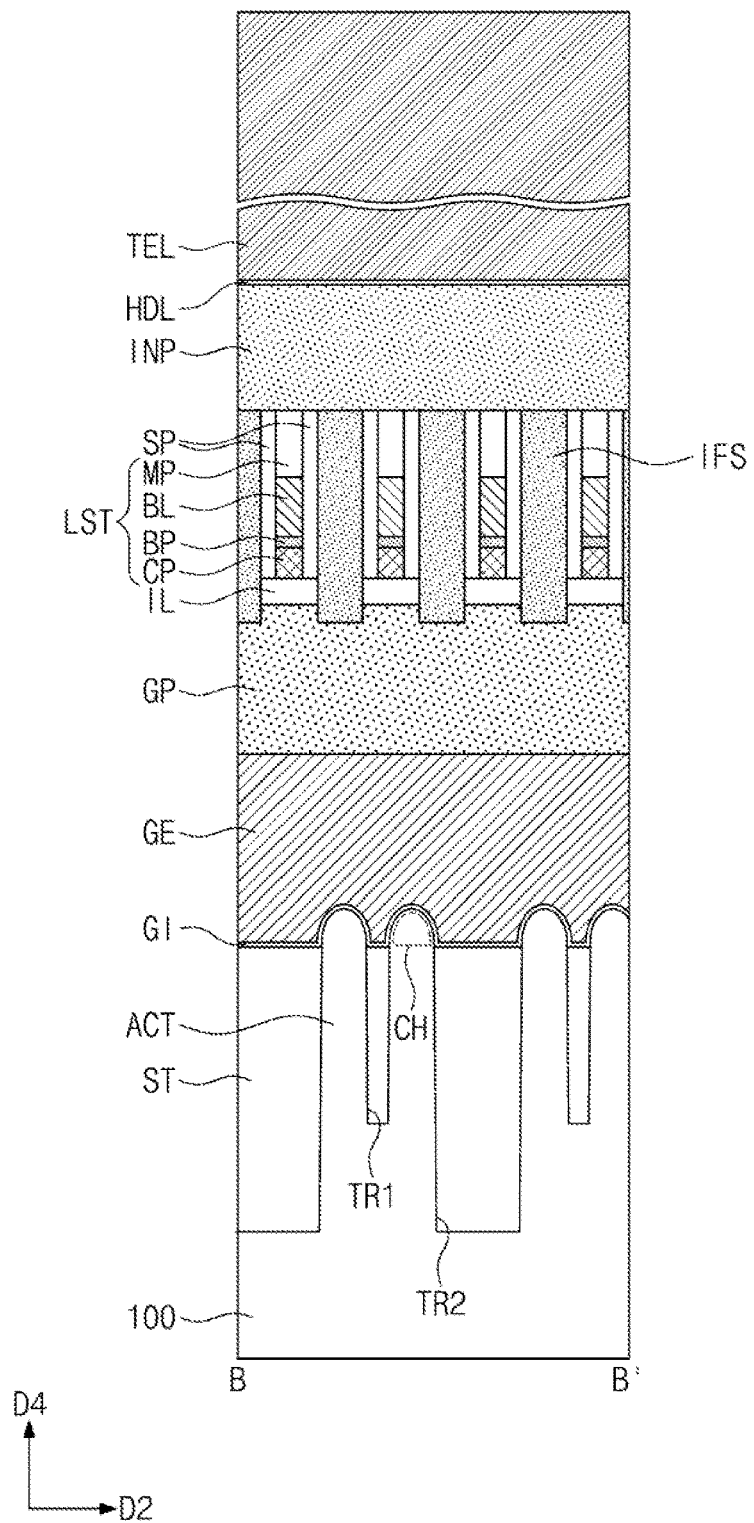

FIG. 1 is a plan view illustrating a semiconductor memory device according to an embodiment of the present inventive concept. FIGS. 2A, 2B, 2C and 2D are cross-sectional views taken along lines A-A', B-B', C-C' and D-D' of FIG. 1, respectively. FIG. 3 is a perspective view illustrating a contact according to an embodiment of the present inventive concept.

Referring to FIGS. 1 and 2A to 2D, a device isolation layer ST defining active patterns ACT may be provided in a substrate 100. The substrate 100 may include a semiconductor material, and may include a group IV semiconductor and/or a III-V compound semiconductor. For example, the substrate 100 may be a semiconductor substrate including, for example, silicon (Si), germanium (Ge), or silicon-germanium (SiGe), and may include multilayers such as, for example, a silicon-on-insulator (SOI) substrate, or a germanium-on-insulator (GOI) substrate. In addition, the substrate 100 may include one or more semiconductor layers or structures and may include active or operable portions of semiconductor devices. The device isolation layer ST may include, for example, a silicon oxide ($SiO_2$) layer, a silicon nitride ($Si_3N_4$) layer, or a silicon oxynitride (SiON) layer.

The active patterns ACT may be formed by patterning an upper portion of the substrate 100. Each of the active patterns ACT may extend in a third direction D3 parallel to a top surface of the substrate 100. In other words, each of active patterns ACT may have an isolated bar shape with a long axis in the third direction D3 when viewed in a plan view. The active patterns ACT may be two-dimensionally arranged in a first direction D1 and a second direction D2. Some of the active patterns ACT may be spaced apart from each other in the third direction D3. The first direction D1 may be substantially perpendicular to the second direction D2. As shown in FIG. 1, the third direction D3 may be inclined by a predetermined angle with respect to the second direction D2 or the first direction D1. The predetermined angle may vary to some degree. In an embodiment of the present inventive concept, the predetermined angle may range from about 10° to about 80°.

Each of the active patterns ACT may have a width which becomes progressively smaller toward its top in a direction (i.e., a fourth direction D4) perpendicular to the top surface of the substrate 100. In other words, the width of each of the active patterns ACT may decrease as a height from a bottom surface of the substrate 100 increases. For example, each of the active patterns ACT may have tapered sidewalls.

First and second trenches TR1 and TR2 may be defined between the active patterns ACT. For example, the first and second trenches TR1 and TR2 may be formed in the substrate 100 by removing an upper portion of the substrate 100 through an anisotropic etching process. The device isolation layer ST may fill the first and second trenches TR1 and TR2 between the active patterns ACT. The first trench TR1 may be defined between a pair of the active patterns ACT adjacent to each other in the second direction D2. The second trench TR2 may be defined between a pair of the active patterns ACT adjacent to each other in the third direction D3.

A distance between the pair of active patterns ACT adjacent to each other in the second direction D2 may be smaller than a distance between the pair of active patterns ACT adjacent to each other in the third direction D3. Thus, the second trench TR2 may be deeper than the first trench TR1. In other words, a bottom of the second trench TR2 may be lower than a bottom of the first trench TR1 (see FIG. 2B).

An upper portion of each of the active patterns ACT may include a first source/drain region SD1 and a pair of second source/drain regions SD2. A top surface of the first source/drain region SD1 may be lower than top surfaces of the pair of second source/drain regions SD2. The first source/drain region SD1 may be located between the pair of second source/drain regions SD2. In other words, the second source/drain region SD2, the first source/drain region SD1 and the second source/drain region SD2 may be sequentially arranged in the third direction D3 when viewed in a plan view. Each of the first source/drain region SD1 and the second source/drain region SD2 may be doped with, for example, N-type impurities or P-type impurities.

Figure 2C:
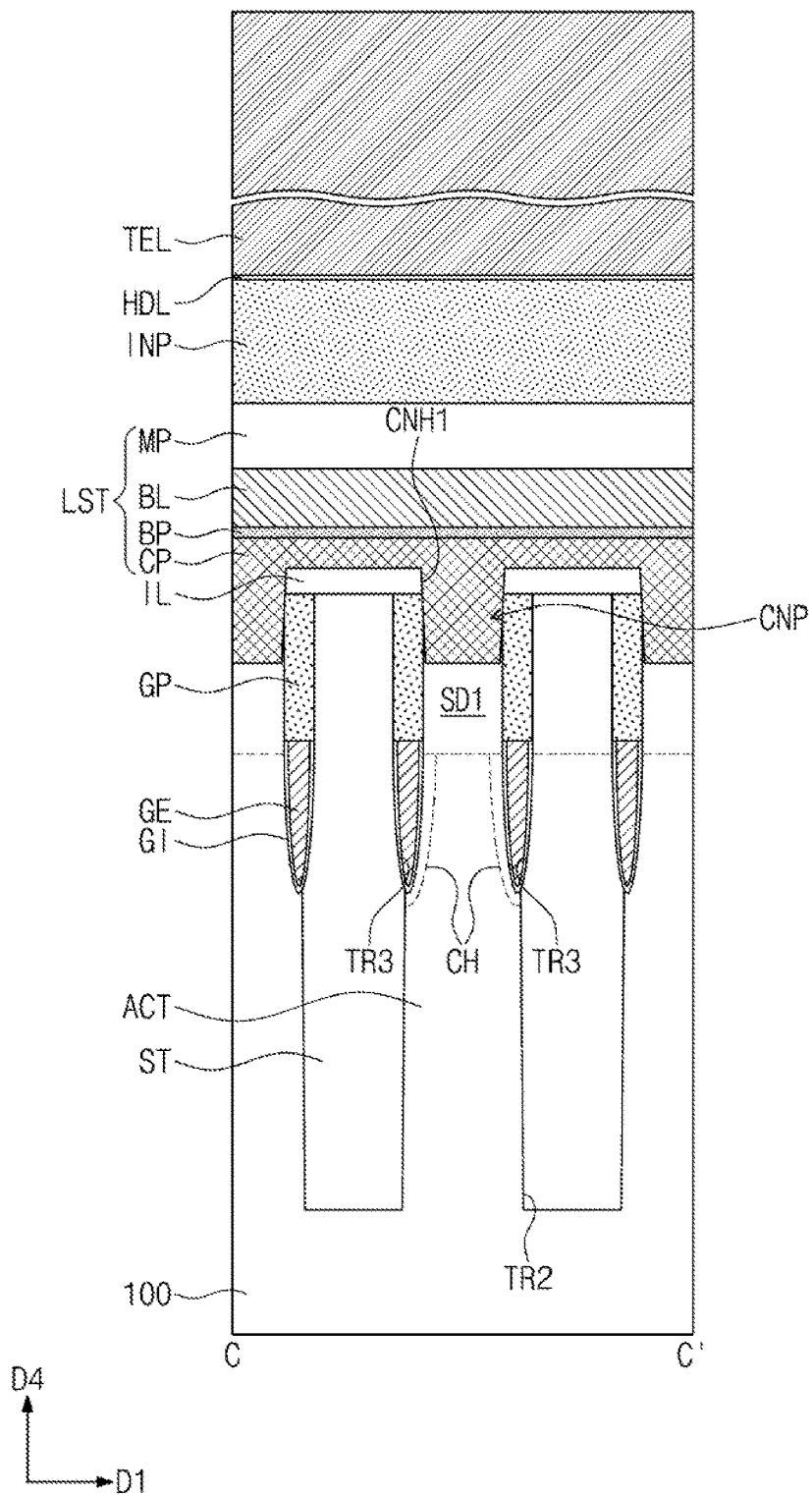
Figure 2D:
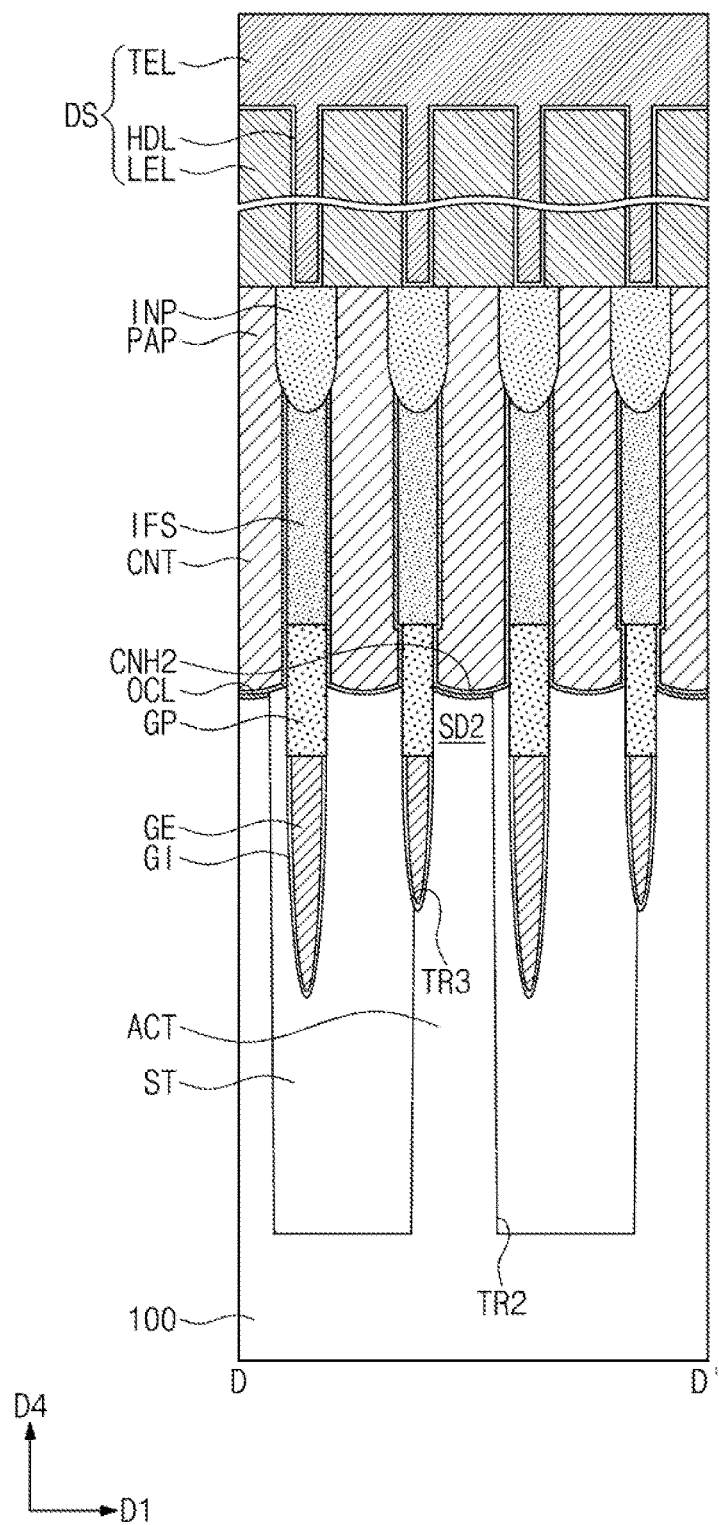
Figure 3:
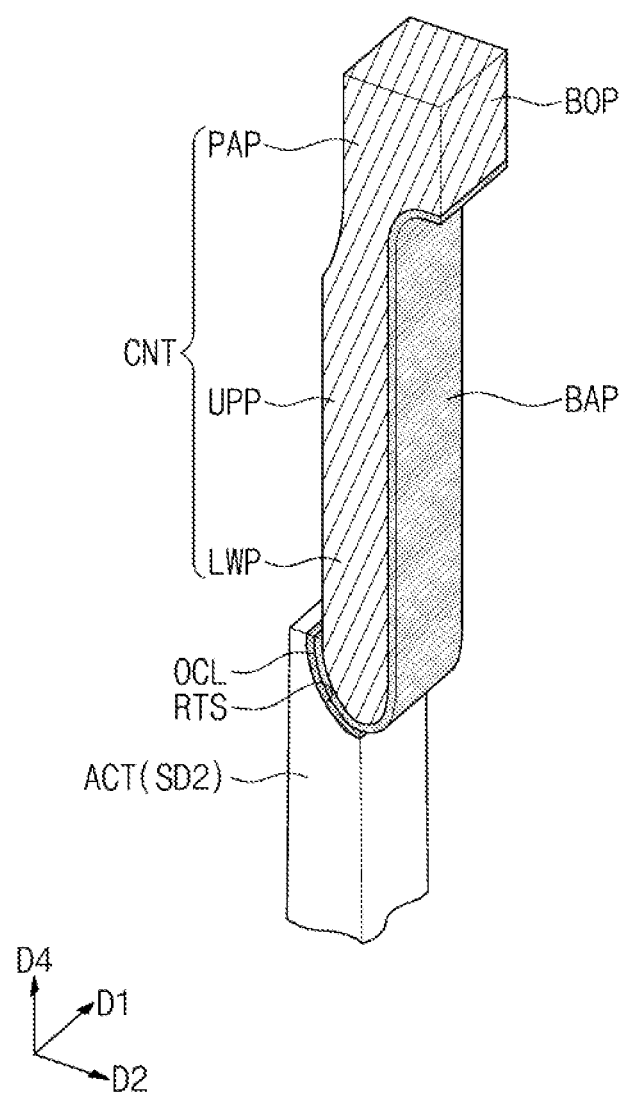
FIG. 3 is a perspective view illustrating a contact according to an embodiment of the present inventive concept.

A pair of third trenches TR3 may be defined in each of the active patterns ACT (see FIG. 2C). Each of the third trenches TR3 may be defined between the first source/drain region SD1 and the second source/drain region SD2. The third trench TR3 may penetrate the upper portion of the active pattern ACT and may extend downward from a top surface of the active pattern ACT toward the bottom surface of the substrate 100. A bottom of the third trench TR3 may be higher than the bottoms of the first and second trenches TR1 and TR2. Also, the third trench TR3 may penetrate the upper portion of the device isolation layer ST and may extend downward from a top surface of the device isolation layer ST toward the bottom surface of the substrate 100 (see FIG. 2D).

The upper portion of each of the active patterns ACT may also include a pair of channel regions CH. The channel region CH may be disposed between the first source/drain region SD1 and the second source/drain region SD2 when viewed in a plan view. The channel region CH may be located under the third trench TR3 (see FIG. 2C). Thus, the channel region CH may be lower than the first and second source/drain regions SD1 and SD2.

Gate electrodes GE may be provided to intersect the active patterns ACT and the device isolation layer ST. The gate electrodes GE may be provided in the third trenches TR3, respectively, and may extend in the second direction D2 in parallel to each other. A pair of the gate electrodes GE may be respectively provided on the pair of channel regions CH of the active pattern ACT. For example, two gate electrodes GE may intersect one active pattern ACT. In other words, the gate electrode GE may be disposed between the first source/drain region SD1 and the second source/drain region SD2 when viewed in a plan view. A transistor may be constituted by one of the gate electrodes GE and its adjacent first source/drain region SD1 and second source/drain region SD2. A top surface of the gate electrode GE may be lower than the top surface of the active pattern ACT (e.g., a top surface of the first source/drain region SD1 or a top surface of the second source/drain region SD2). As the gate electrodes GE are disposed within the third trenches TR3, each of gate electrodes GE may be provided thereunder with a channel region CH whose length becomes increased within a limited planar area. Accordingly, the short channel effect and the like may be minimized.

Referring again to FIG. 2C, an upper portion of the gate electrode GE may be adjacent to the first source/drain region SD1 of the active pattern ACT. A lower portion of the gate electrode GE may be adjacent to the channel region CH.

Referring to FIGS. 1 and 2A to 2D, a gate dielectric layer GI may be disposed between the gate electrode GE and the active pattern ACT. A gate capping layer GP may be provided on the gate electrode GE. The gate capping layer GP may have a linear shape extending along a longitudinal direction of the gate electrode GE, and may cover the entire top surface of the gate electrode GE. A top surface of the gate capping layer GP may be substantially coplanar with the top surface of the active pattern ACT.

The gate electrode GE may include a conductive metal nitride (e.g., titanium nitride (TiN) or tantalum nitride (TaN)) and/or a metal material (e.g., titanium (Ti), tantalum (Ta), tungsten (W), copper (Cu), or aluminum (Al)). The gate dielectric layer GI may include, for example, a silicon oxide ($SiO_2$) layer, a silicon nitride ($Si_3N_4$) layer, a silicon oxynitride (SiON) layer, and/or a high-k dielectric layer. The high-k dielectric layer may have a dielectric constant greater than that of the silicon oxide ($SiO_2$). For example, the high-k dielectric layer may include, for example, hafnium oxide ($HfO_2$), hafnium-silicon oxide ($HfSiO_4$), hafnium-zirconium oxide ($HfZrO_4$), hafnium-tantalum oxide ($Hf_2Ta_2O_9$), hafnium-aluminum oxide ($HfAlO_3$), lanthanum oxide ($La_2O_3$), lanthanum-aluminum oxide ($LaAlO_3$), zirconium oxide ($ZrO_2$), zirconium-silicon oxide ($ZrSiO_4$), tantalum oxide ($Ta_2O_5$), titanium oxide ($TiO_2$), barium-strontium-titanium oxide ($BaSrTi_2O_6$), barium-titanium oxide ($BaTiO_3$), strontium-titanium oxide ($SrTiO_3$), yttrium oxide ($Y_2O_3$), lithium oxide ($Li_2O$), aluminum oxide ($Al_2O_3$), lead-scandium-tantalum oxide ($Pb(Sc,Ta)O_3$), lead-zinc niobate [$Pb(Zn_{1/3}Nb_{2/3})O_3$], or any combination thereof. The gate capping layer GP may include at least one of, for example, a silicon oxide ($SiO_2$) layer, a silicon nitride ($Si_3N_4$) layer, or a silicon oxynitride (SiON) layer.

An insulating layer IL may be provided on the substrate 100, and may include first contact holes CNH1 exposing the first source/drain regions SD1 of the active patterns ACT. Due to the formation of the first contact holes CNH1, a top surface of the first source/drain regions SD1 may be lower than a top surface of the second source/drain regions SD2. For example, the insulating layer IL may include a first insulating layer and a second insulating layer which are sequentially stacked. A dielectric constant of the second insulating layer may be greater than a dielectric constant of the first insulating layer. For example, the first insulating layer may include a silicon oxide ($SiO_2$) layer, and the second insulating layer may include a silicon oxynitride (SiON) layer.

Line structures LST extending in the first direction D1 in parallel to each other may be provided on the insulating layer IL. The line structures LST may be arranged in the second direction D2, and may perpendicularly intersect the gate electrodes GE when viewed in a plan view (see FIG. 1). Also, the line structures LST may intersect the active patterns ACT which extend in the third direction D3. A pair of spacers SP may be provided on both sidewalls of each of the line structures LST, respectively. Each of the spacers SP may include at least one of, for example, a silicon oxide ($SiO_2$) layer, a silicon nitride ($Si_3N_4$) layer, or a silicon oxynitride (SiON) layer.

Each of the line structures LST may include a conductive pattern CP, a barrier pattern BP, a bit line BL and a mask pattern MP, which are sequentially stacked. The conductive pattern CP may include a contact portion CNP which fills the first contact hole CNH1 and is connected to the first source/drain region SD1. For example, the contact portion CNP may penetrate the insulating layer IL and may extend toward the bottom surface of the substrate 100. A bottom surface of the contact portion CNP may be lower than the top surface of the substrate 100 (i.e., the top surface of the active pattern ACT). The bottom surface of the contact portion CNP may be lower than a bottom surface of the insulating layer IL, and may be lower than a bottom of a contact CNT to be described later. The bottom surface of the contact portion CNP may be in direct contact with the first source/drain region SD1. For example, the conductive pattern CP may penetrate the insulating layer IL so as to be connected to the first source/drain region SD1. For example, a bottom surface of the conductive pattern CP, which is in contact with the first source/drain region SD1, may be lower than a bottom of a metal contact formed of the first metal pattern BOP and the second metal pattern BAP to be described.

The barrier pattern BP interposed between the bit line BL and the conductive pattern CP may inhibit or prevent a metal material in the bit line BL from being diffused into the conductive pattern CP. The bit line BL may be electrically connected to the first source/drain region SD1 through the barrier pattern BP and the conductive pattern CP.

The conductive pattern CP may include a doped semiconductor material (e.g., doped silicon (Si), doped germanium (Ge), etc.). The barrier pattern BP may include a conductive metal nitride (e.g., titanium nitride (TiN) or tantalum nitride (TaN)). The bit line BL may include a metal material (e.g., titanium (Ti), tantalum (Ta), tungsten (W), copper (Cu), or aluminum (Al)).

A plurality of insulating fences IFS may be provided on the gate capping layer GP. Each of the insulating fences IFS may penetrate the insulating layer IL and may extend into an upper portion of the gate capping layer GP. The insulating fences IFS may be formed of an insulating layer such as, for example, a silicon oxide ($SiO_2$) layer, a silicon nitride ($Si_3N_4$) layer, or a silicon oxynitride (SiON) layer Referring again to FIG. 1, the insulating fences IFS may each be an isolated shape when viewed in a plan view, and may be two-dimensionally arranged in the first direction D1 and the second direction D2. For example, the insulating fences IFS may be arranged in the second direction D2 on the gate capping layer GP extending in the second direction D2. The insulating fences IFS and the line structures LST may be alternately arranged in the second direction D2.

Contacts CNT may penetrate the insulating layer IL so as to be electrically connected to the second source/drain regions SD2, respectively. Each of the contacts CNT may fill a second contact hole CNH2 formed by partially etching an upper portion of the second source/drain region SD2. For example, the second contact hole CNH2 may be formed by penetrating the insulating layer IL and recessing an upper portion of the second source/drain region SD2 and an upper portion of the device isolation layer ST around the second source/drain region SD2.

Referring again to FIG. 1, the contacts CNT may be two-dimensionally arranged in the first direction D1 and the second direction D2. For example, the contacts CNT and the line structures LST may be alternately arranged in the second direction D2. The contacts CNT and the insulating fences IFS may be alternately arranged in the first direction D1. For example, the contacts CNT may be arranged in a matrix form.

An interface layer OCL and the contact CNT according to the present inventive concept will be described in more detail with reference to FIGS. 2A and 3. The interface layer OCL may be disposed between the contact CNT and the second source/drain region SD2 exposed by the second contact hole CNH2. The interface layer OCL may directly cover the exposed surface of the second source/drain region SD2. For example, the interface layer OCL may cover a recessed top surface RTS of the second source/drain region SD2 exposed by the second contact hole CNH2 (see FIG. 3). The contact CNT may be connected to the second source/drain region SD2 through the interface layer OCL. The interface layer OCL may form an ohmic contact between a metal of the contact CNT and a semiconductor of the second source/drain region SD2. For example, in an embodiment of the present inventive concept, the interface layer OCL may be formed directly on the active pattern ACT, and may be applied directly between silicon (Si) of the active pattern ACT and the metal of the contact CNT, without adding a polysilicon (p-Si) layer between the interface layer OCL and the active pattern ACT.

In an embodiment of the present inventive concept, the interface layer OCL may include a single layer formed of two-dimensionally arranged atoms. The atoms of the single layer may be covalently bonded to each other. For example, the interface layer OCL may include a single atomic layer, or a multilayer in which atomic layers are stacked. The multilayer may have a structure in which 2 to 100 atomic layers are vertically stacked. Here, the atomic layers of the multilayer may be bonded to each other by van der Waals attractive force. The interface layer OCL may include an allotrope (e.g., graphene) of carbon (C) or an allotrope (e.g., phosphorene) of phosphorus (P). The interface layer OCL may be formed using a deposition process such as, for example, an atomic layer deposition (ALD) process or a chemical vapor deposition (CVD) process. The interface layer OCL may have a thickness greater than 0 nm and less than about 200 nm. For example, the interface layer OCL may have a thickness in a range from about 1 nm to about 5 nm. The term "about" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

In an embodiment of the present inventive concept, the interface layer OCL may include a metal-semiconductor compound, e.g., a metal silicide.

The contact CNT may include a lower portion LWP, an upper portion UPP on the lower portion LWP, and a pad portion PAP on the upper portion UPP. The lower portion LWP may be provided in the second contact hole CNH2 and may be in contact with the interface layer OCL. In other words, the lower portion LWP of the contact CNT and the interface layer OCL may be provided in the second contact hole CNH2. The lower portion LWP may be electrically connected to the second source/drain region SD2 through the interface layer OCL, and may be located at a level lower than the top surface of the substrate 100 (i.e., the top surface of the active pattern ACT). The lower portion LWP may be located at a level lower than the bottom surface of the insulating layer IL. For example, the contact CNT according to an embodiment of the present inventive concept may be a buried contact having a reduced resistance by using graphene or phosphorene as the interface layer OCL to directly connect the contact CNT and the second source/drain region SD2.

The upper portion UPP may be disposed between the line structures LST adjacent to each other. For example, the upper portion UPP may be in direct contact with a pair of the spacers SP facing each other. For example, the upper portion UPP may be provided on the lower portion LWP, and may vertically extend along the spacers SP. The upper portion UPP may be spaced apart from the line structure LST adjacent thereto by the spacer SP. For example, the contact CNT may be electrically connected to the second source/drain region SD2, and may be spaced apart from the bit line BL with the spacer SP interposed therebetween.

The pad portion PAP may be misaligned with the upper portion UPP. In other words, a center of a top surface of the pad portion PAP may be offset from a center of the upper portion UPP in the second direction D2 (see FIG. 2A).

An insulating pattern INP may be provided on the mask patterns MP, and may define planar shapes of the pad portions PAP. Adjacent pad portions PAP may be separated from each other by the insulating pattern INP. A top surface of the insulating pattern INP may be substantially coplanar with the top surface of the pad portion PAP.

The contact CNT may include a first metal pattern BOP and a second metal pattern BAP surrounding a surface of the first metal pattern BOP. The first metal pattern BOP may include a metal material (e.g., titanium (Ti), tantalum (Ta), tungsten (W), copper (Cu), or aluminum (Al)). The second metal pattern BAP may function as a barrier for preventing diffusion of a metal element in the first metal pattern BOP. The second metal pattern BAP may include a conductive metal nitride (e.g., titanium nitride (TiN) or tantalum nitride (TaN)). The second metal pattern BAP may be disposed between the first metal pattern BOP and the interface layer OCL. The contact CNT according to the present embodiment may be a metal contact formed of the first metal pattern BOP and the second metal pattern BAP without a semiconductor material.

According to an embodiment of the present inventive concept, the contact CNT connected to the second source/drain region SD2 may be a metal contact formed of a metal material. Since a resistivity of a metal is lower than a resistivity of a doped semiconductor material, the contact CNT according to the present embodiment may have a relatively low resistance. Thus, a semiconductor memory device with enhanced electrical characteristics may be provided. In addition, when graphene is used as the interface layer OCL interposed between the metal material of the contact CNT and the semiconductor material of the second source/drain region SD2, a low resistance ohmic contact may be formed by the graphene. Accordingly, the electrical characteristics of the semiconductor memory device may be further enhanced.

Figure 22:
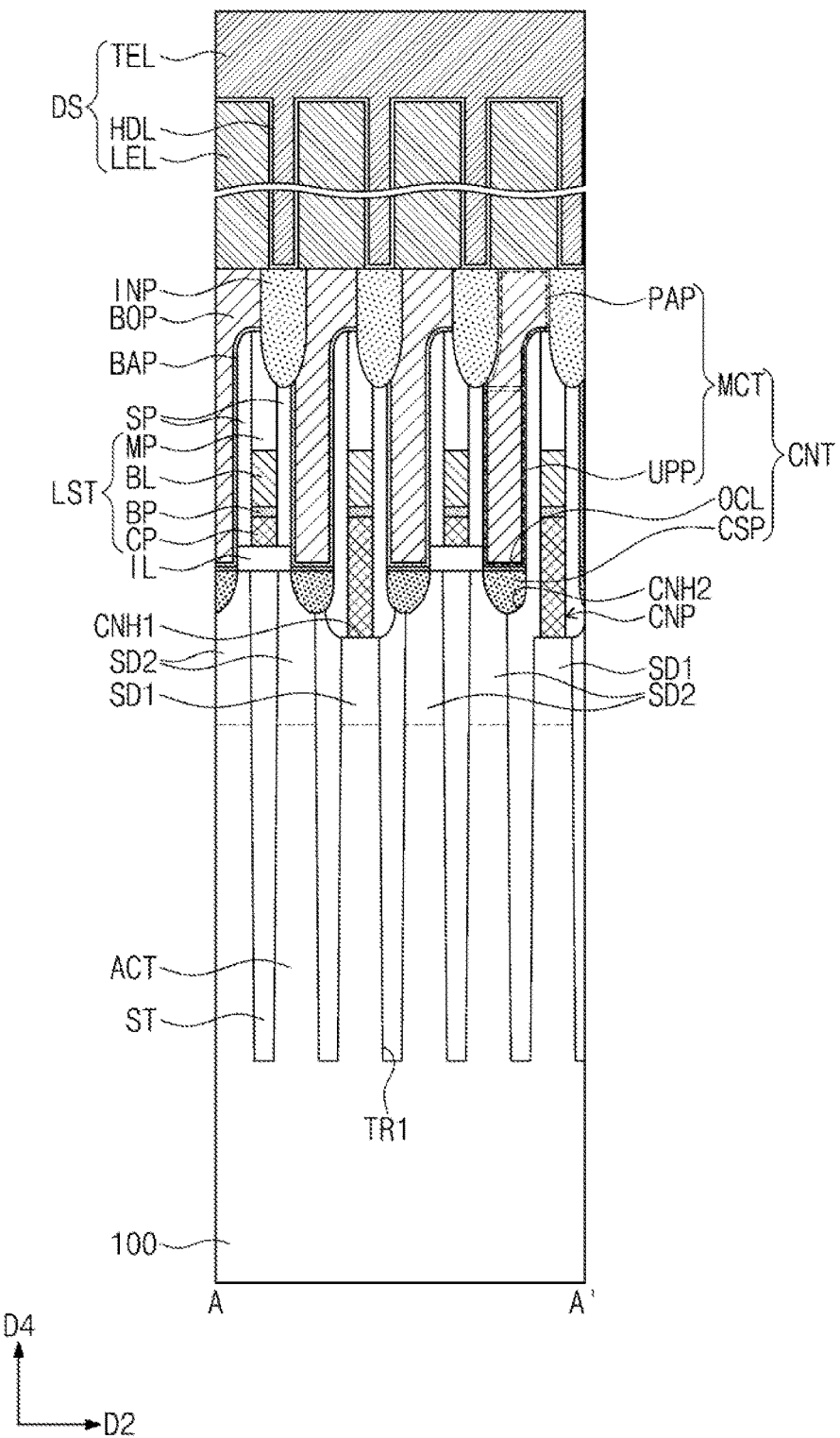

According to a comparative example of the present inventive concept, a semiconductor pattern which is in contact with the second source/drain region SD2 may be formed in the second contact hole CNH2, as illustrated in FIG. 22 to be described later. A silicide may be formed on the semiconductor pattern, and a metal contact may be formed on the silicide. This may be because the silicide can not be formed on a bottom of the second contact hole CNH2 which is lower than the top surface of the substrate 100. Thus, a height at which the silicide is formed may be secured using the semiconductor pattern. In this case, using the silicide as the metal contact in combination with the semiconductor pattern may provide higher resistance and lower performance in electrical characteristics of the semiconductor device in comparison to the use of graphene as an ohmic contact in the present embodiment. In addition, any reduction in size of the semiconductor pattern and/or the silicide contact of the comparative example, the resistance may further increase to reduce the electrical performance of the semiconductor device.

According to the present embodiment, the metal of the contact CNT and the semiconductor of the second source/drain region SD2 may not be in direct contact with each other but may be connected to each other in the form of the ohmic contact using the interface layer OCL (e.g., graphene). Thus, the second source/drain region (the semiconductor) SD2 and the contact (the metal) CNT may be connected to each other without an additional silicide. Since the silicide is omitted, a bottom of the metal of the contact CNT may be deeply formed to a level lower than the top surface of the substrate 100. For example, a bottom of the first metal pattern BOP of the contact CNT may be lower than the top surface of the substrate 100.

According to an embodiment of the present inventive concept, a buried contact (i.e., the contact CNT described above) of a DRAM device may be formed of a metal without a semiconductor material, and thus a resistance of the buried contact may be relatively reduced. A planar size of the contact CNT may be reduced due to the reduction in resistance of the contact CNT, and thus the semiconductor memory device may be highly integrated.

A data storage element DS may be provided on the pad portions PAP of the contacts CNT. For example, the data storage element DS may include first electrodes LEL provided on the pad portions PAP, respectively, and may be connected to the pad portions PAP, respectively. The data storage element DS may further include a second electrode TEL formed on the first electrodes LEL, and a dielectric layer HDL interposed between the second electrode TEL and the first electrodes LEL. The first electrode LEL, the dielectric layer HDL and the second electrode TEL may constitute a capacitor for storing data.

Each of the first electrodes LEL may have a solid pillar shape. However, the present inventive concept is not limited thereto. In an embodiment of the present inventive concept, each of the first electrodes LEL may have a hollow cylinder shape having a closed bottom end. The first electrodes LEL may be arranged in a zigzag form along the first direction D1 or the second direction D2 and thus may be arranged in a honeycomb form. Alternatively, the first electrodes LEL may be arranged in a matrix form along the first direction D1 and the second direction D2.

Each of the first electrodes LEL may be formed of silicon (Si) doped with dopants, a metal (e.g., tungsten (W)), or a conductive metal compound (e.g., titanium nitride (TiN)). The dielectric layer HDL may include a high-k dielectric material, for example, hafnium oxide ($HfO_2$), hafnium-silicon oxide ($HfSiO_4$), hafnium-zirconium oxide ($HfZrO_4$), hafnium-tantalum oxide ($Hf_2Ta_2O_9$), hafnium aluminum oxide ($HfAlO_3$), lanthanum oxide ($La_2O_3$), lanthanum-aluminum oxide ($LaAlO_3$), zirconium oxide ($ZrO_2$), zirconium-silicon oxide ($ZrSiO_4$), tantalum oxide ($Ta_2O_5$), titanium oxide ($TiO_2$), barium-strontium-titanium oxide ($BaSrTi_2O_6$), barium-titanium oxide ($BaTiO_3$), strontium-titanium oxide ($SrTiO_3$), yttrium oxide ($Y_2O_3$), lithium oxide ($Li_2O$), aluminum oxide ($Al_2O_3$), lead-scandium-tantalum oxide ($Pb(Sc,Ta)O_3$), lead-zinc niobate [$Pb(Zn_{1/3}Nb_{2/3})O_3$], or any combination thereof. The second electrode TEL may include doped silicon (Si), ruthenium (Ru), ruthenium oxide (RuO), platinum (Pt), platinum oxide (PtO), iridium (Ir), iridium oxide (IrO), strontium-ruthenium oxide (SRO(SrRuO)), barium-strontium-ruthenium oxide (BSRO((Ba,Sr)Ru)), calcium-ruthenium oxide (CRO(CaRuO)), barium-ruthenium oxide (BRO(BaRuO)), lanthanum-strontium-cobalt oxide (La(Sr,Co)O), titanium (Ti), titanium nitride (TiN), tungsten (W), tungsten nitride (WN), tantalum (Ta), tantalum nitride (TaN), titanium-aluminum nitride (TiAlN), titanium-silicon nitride (TiSiN), tantalum-aluminum nitride (TaAlN), tantalum-silicon nitride (TaSiN), or any combination thereof.

Figure 4:
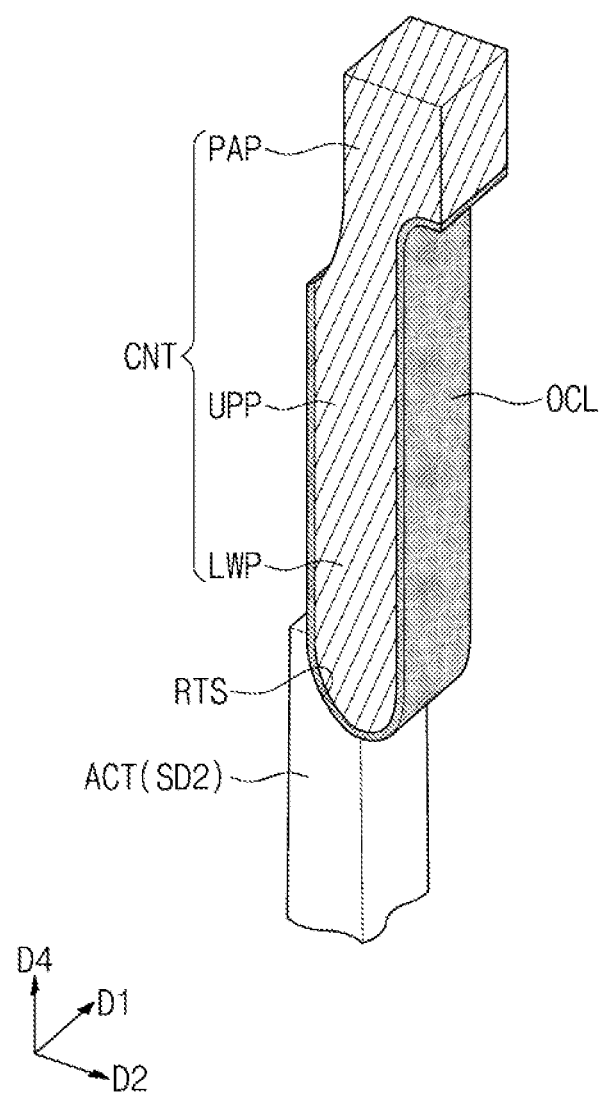
FIG. 4 is a perspective view illustrating another example of the contact of FIG. 3 according to an embodiment of the present inventive concept.
Figure 5:
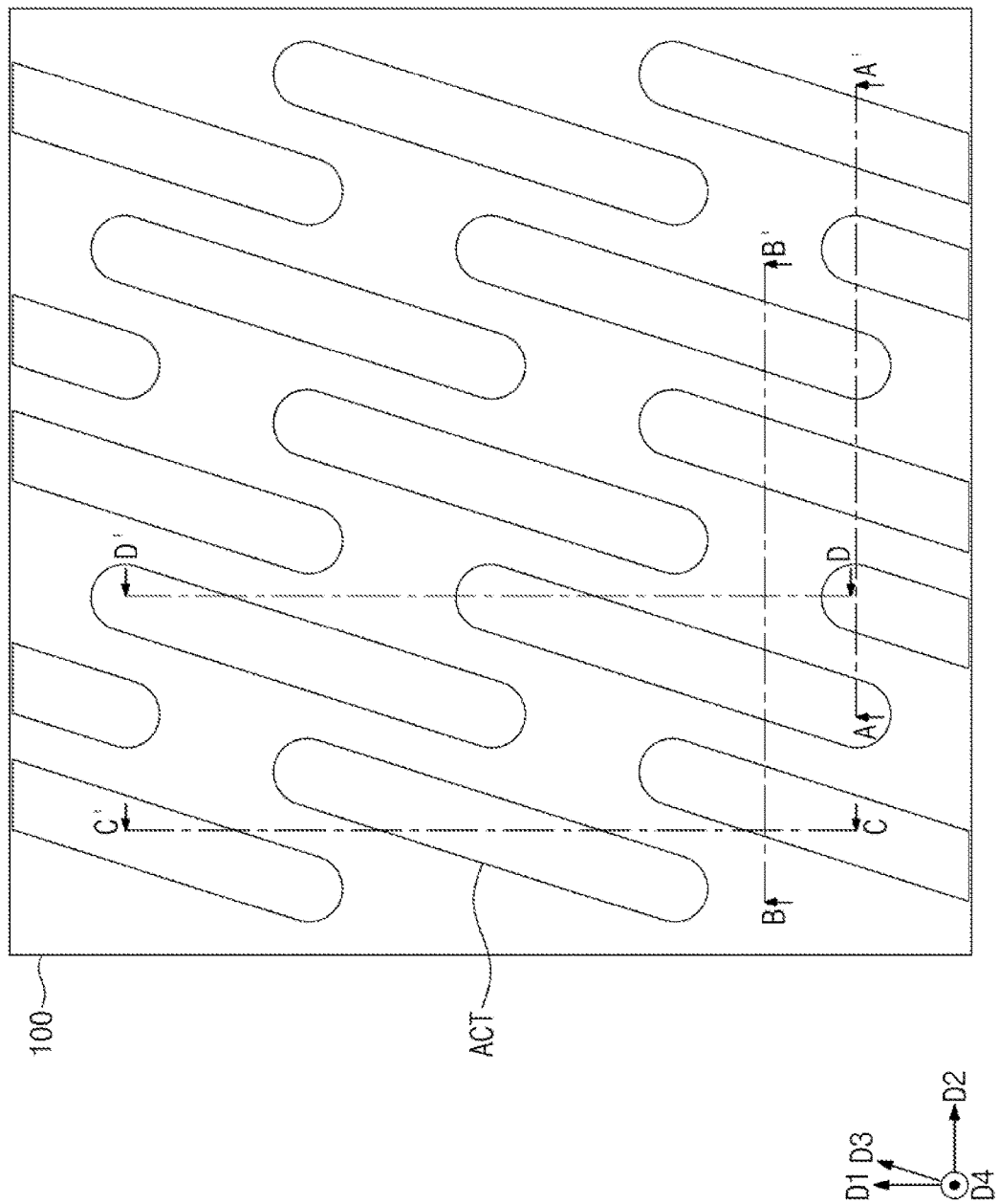
FIGS. 5, 7, 9, 11, 13, 15, 17 and 19 are plan views illustrating a method for manufacturing a semiconductor memory device according to an embodiment of the present inventive concept.
Figure 6A:
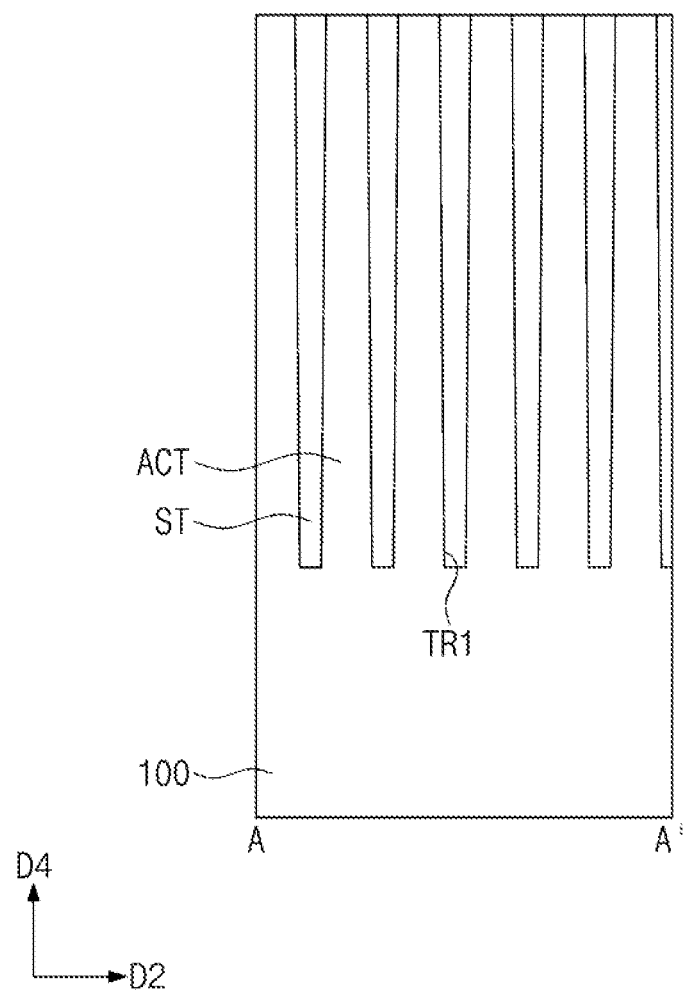
FIGS. 6A, 8A, 10A, 12A, 14A, 16A, 18A and 20A are cross-sectional views taken along lines A-A' of FIGS. 5, 7, 9, 11, 13, 15, 17 and 19, respectively.
Figure 6B:
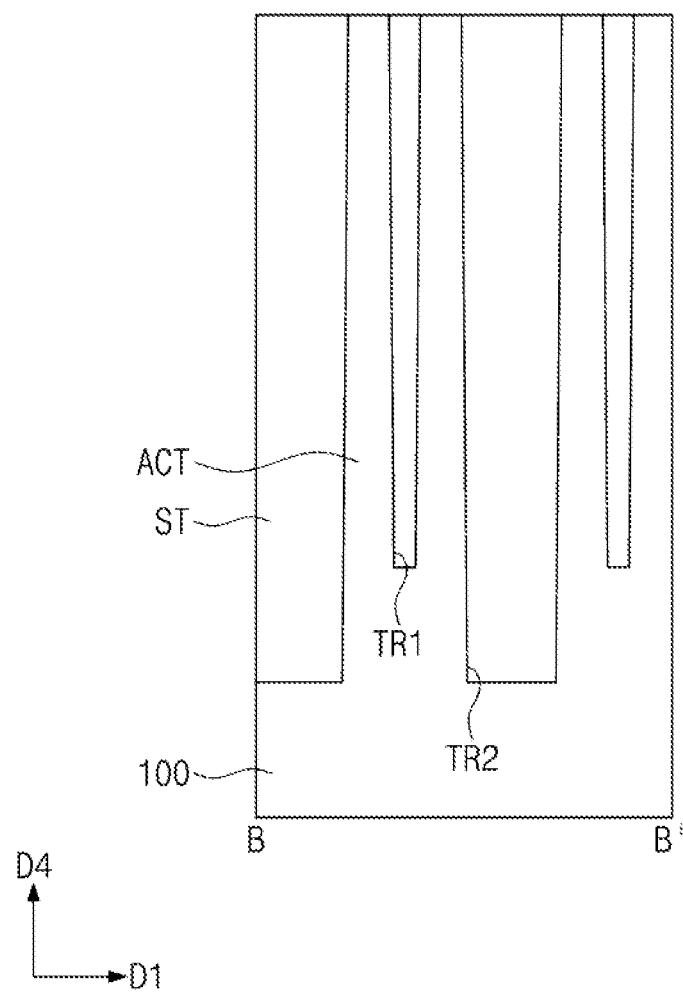
FIGS. 6B, 8B, 10B, 12B, 14B, 16B, 18B and 20B are cross-sectional views taken along lines B-B' of FIGS. 5, 7, 9, 11, 13, 15, 17 and 19, respectively.
Figure 6C:
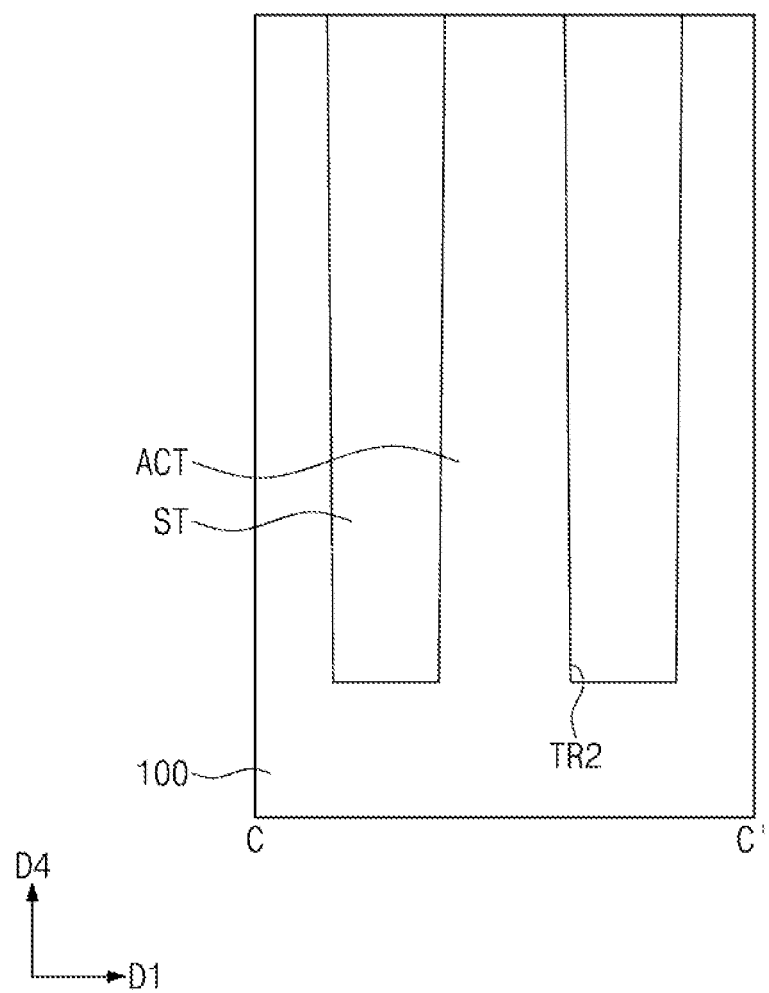
FIGS. 6C, 8C, 10C, 12C, 14C, 16C, 18C and 20C are cross-sectional views taken along lines C-C' of FIGS. 5, 7, 9, 11, 13, 15, 17 and 19, respectively.
Figure 6D:
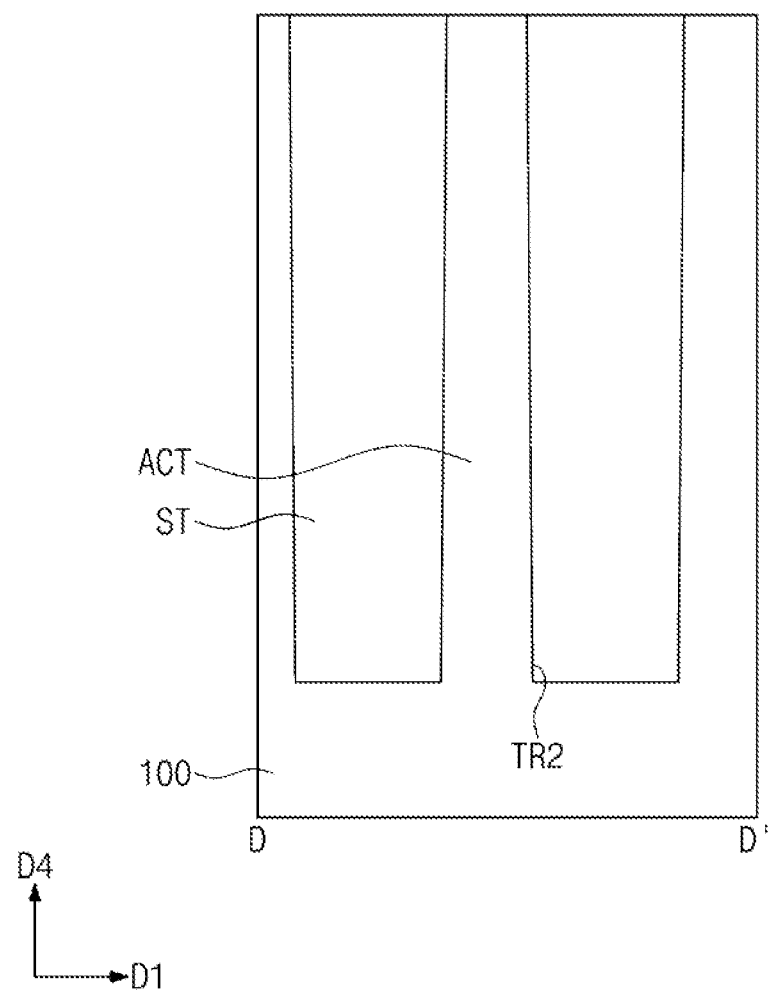
FIGS. 6D, 8D, 10D, 12D, 14D, 16D, 18D and 20D are cross-sectional views taken along lines D-D' of FIGS. 5, 7, 9, 11, 13, 15, 17 and 19, respectively.
Figure 7:
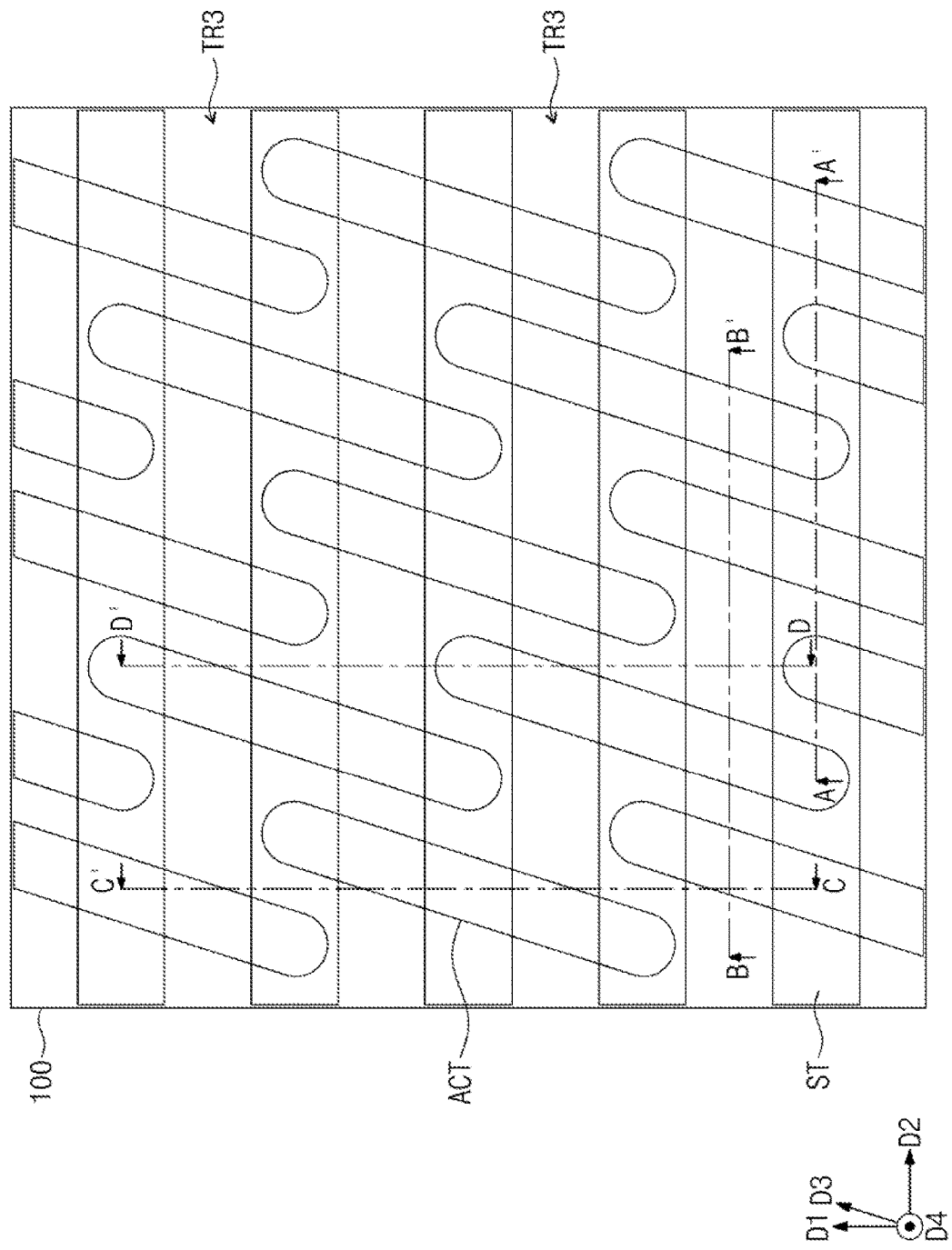
Figure 8A:
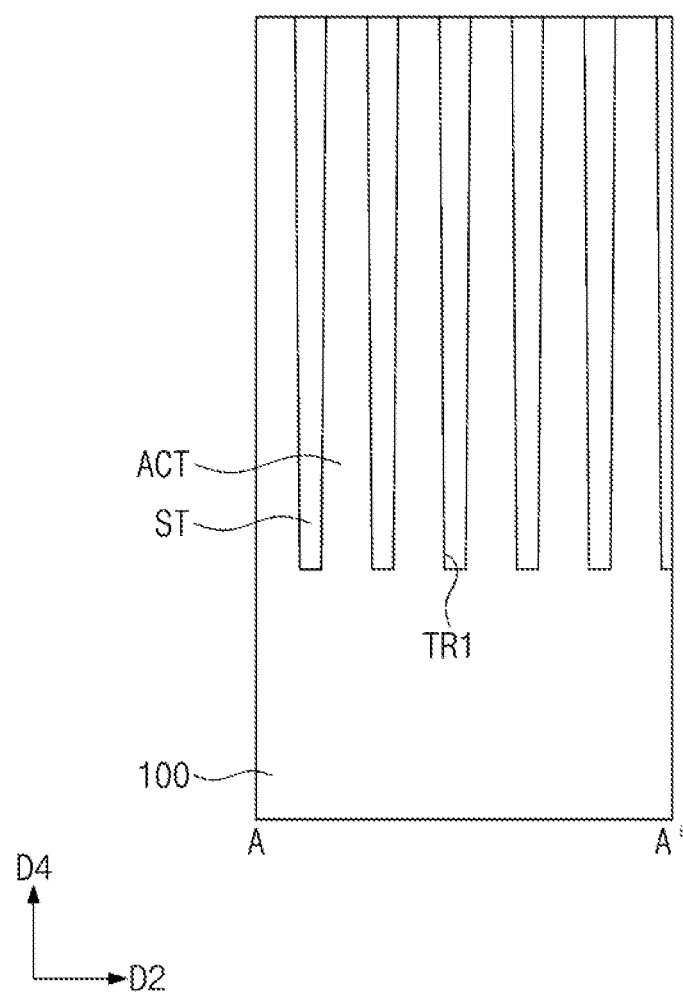
Figure 8B:
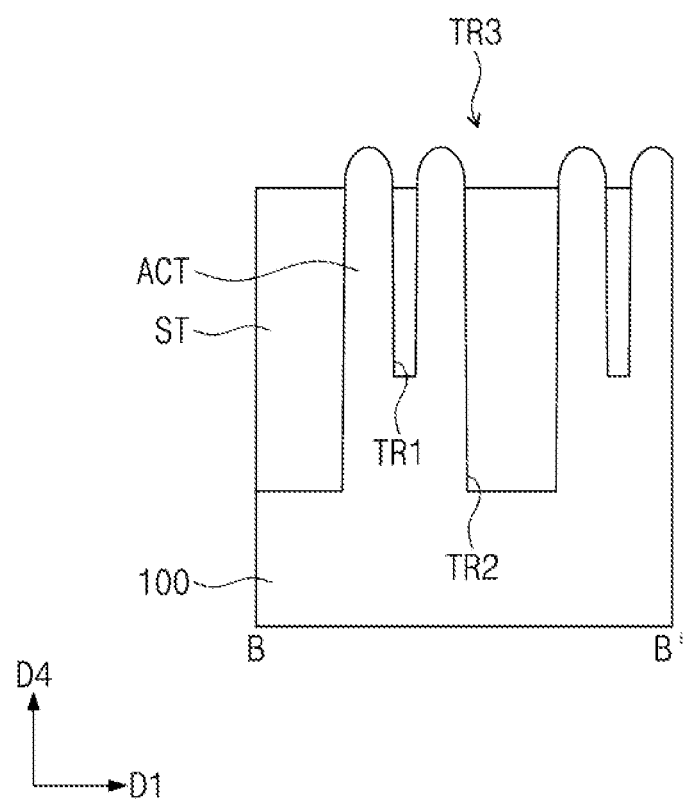
Figure 8C:
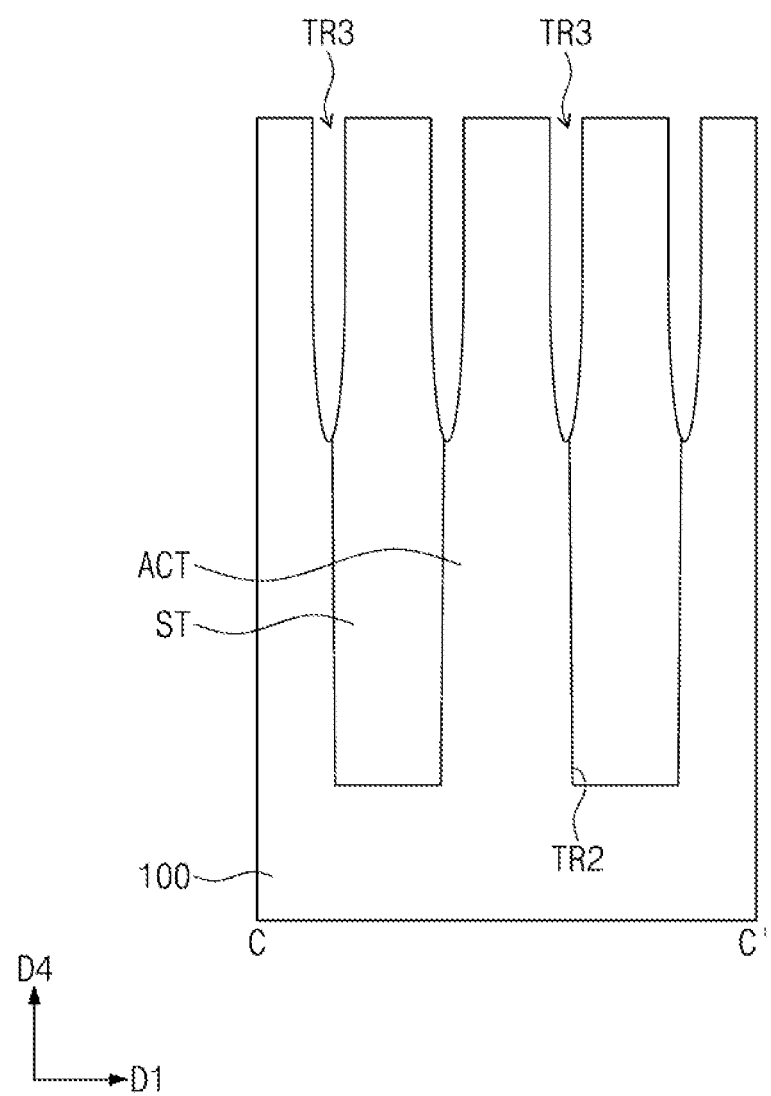
Figure 8D:
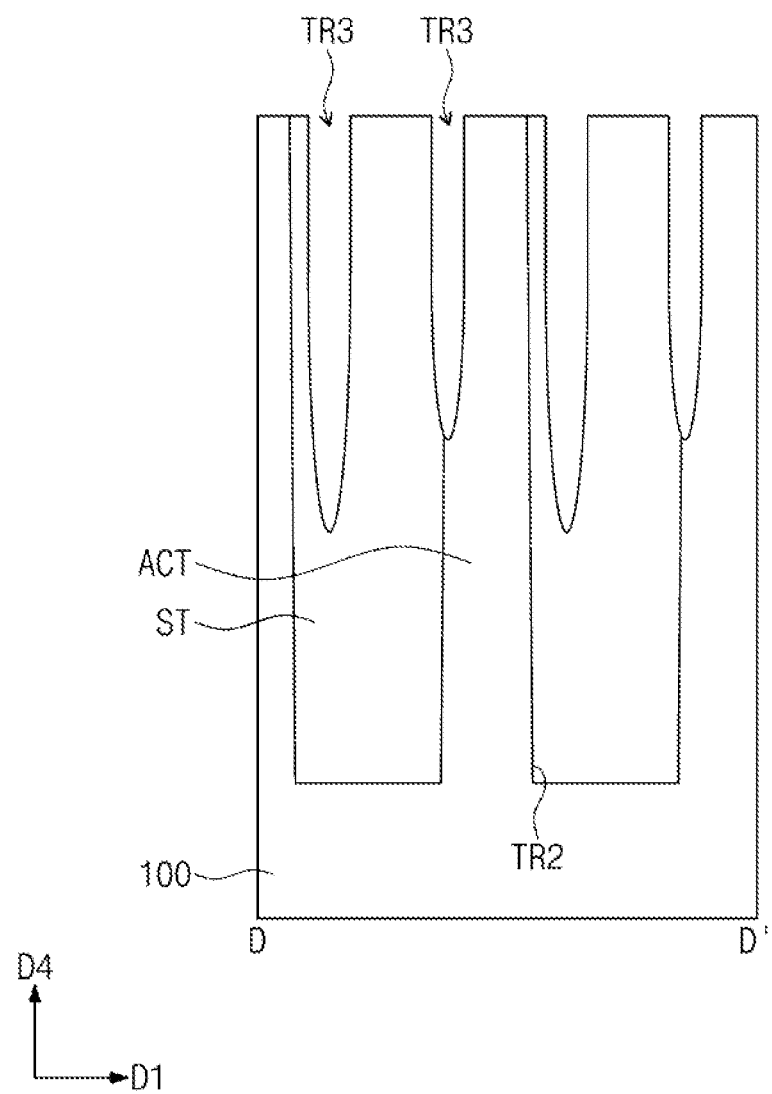
Figure 9:
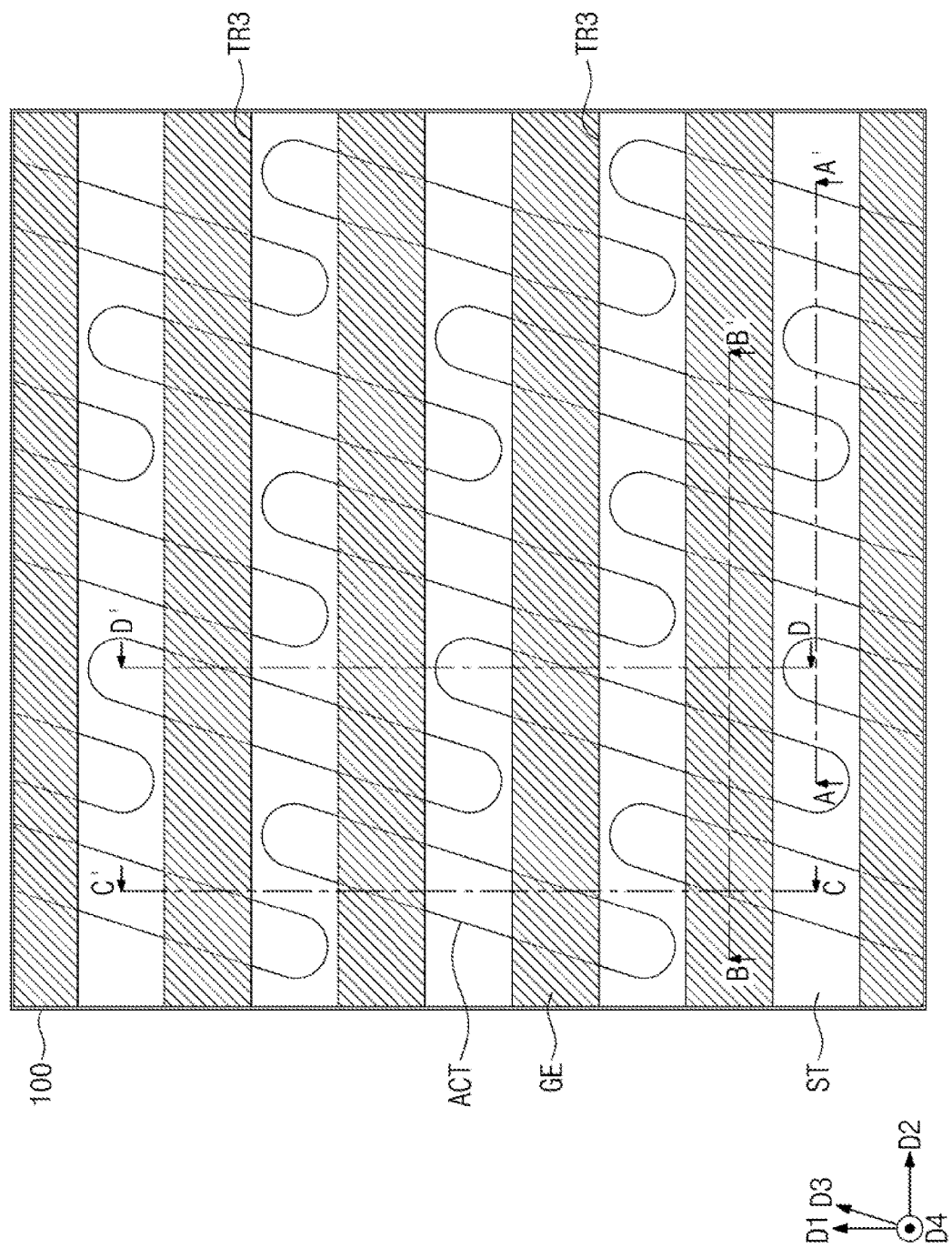
Figure 10A:
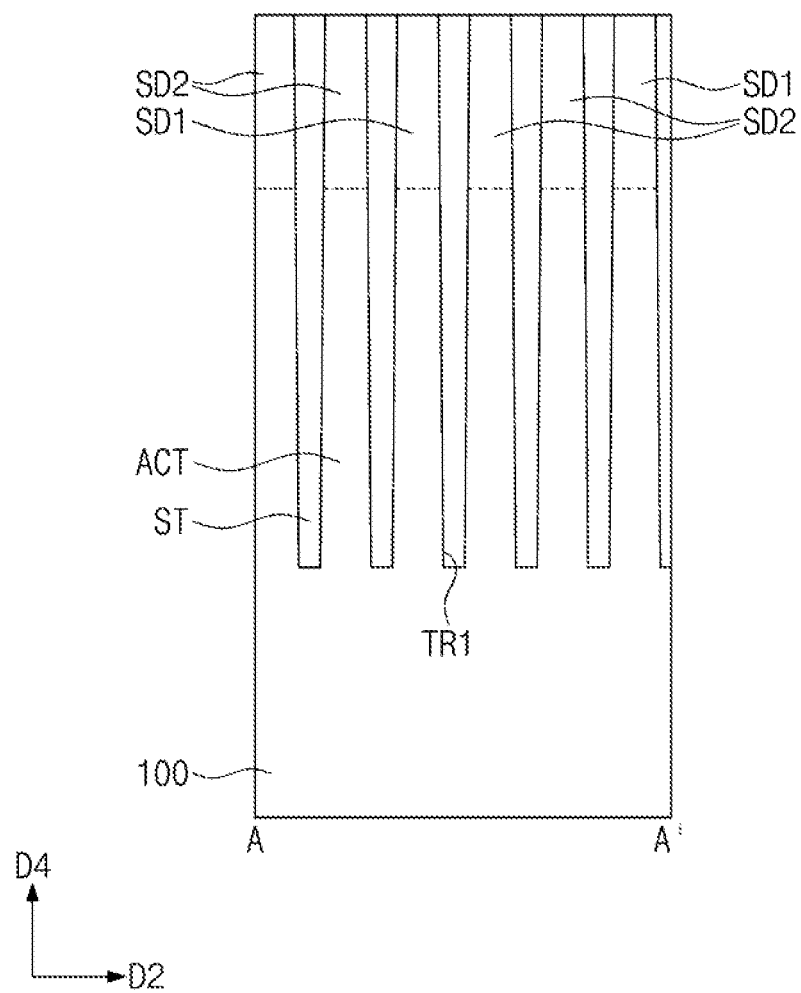
Figure 10B:
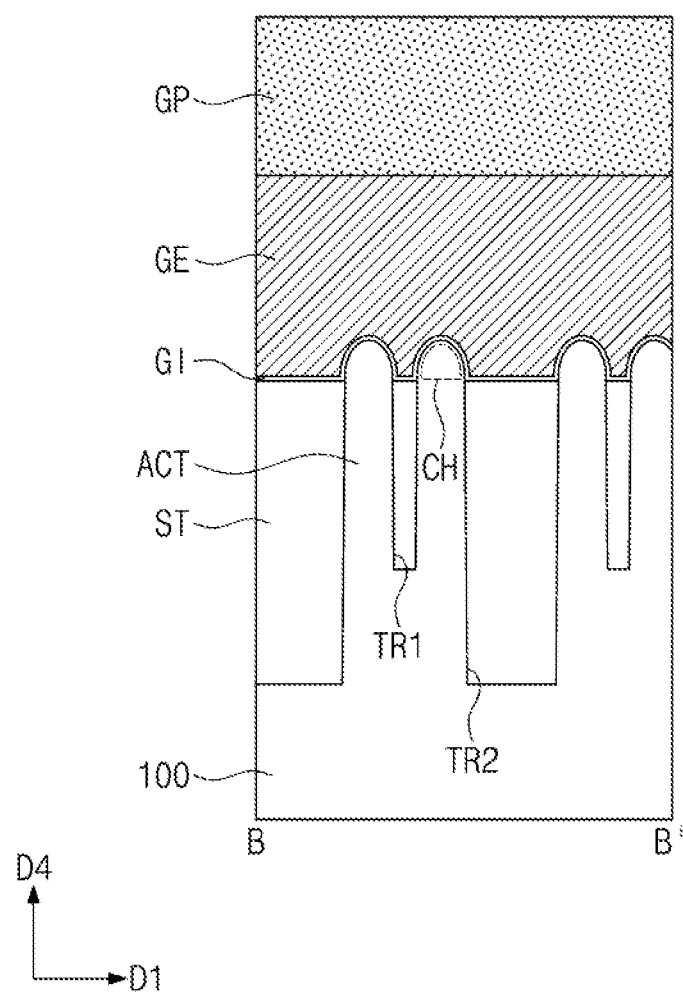
Figure 10C:
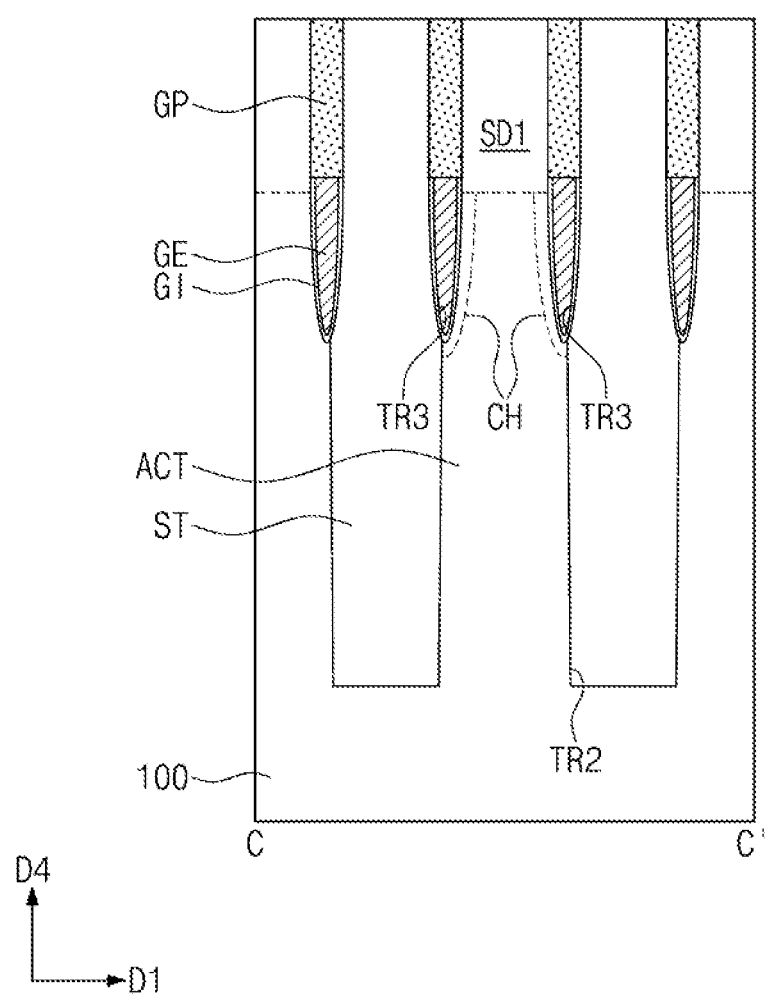
Figure 10D:
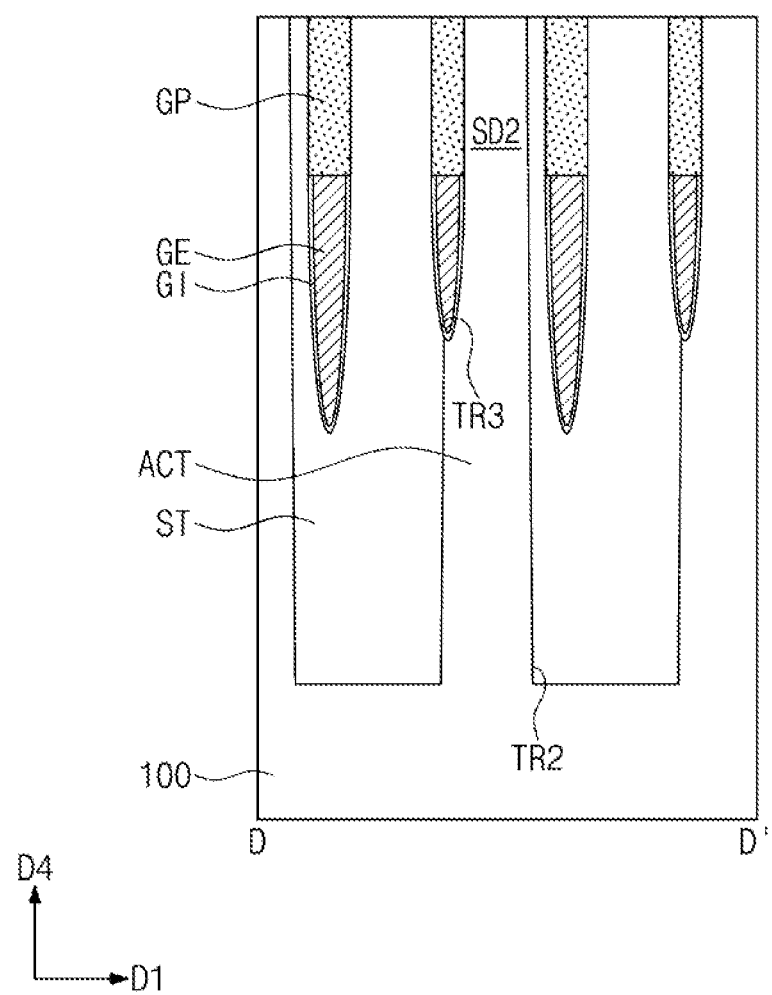
Figure 11:
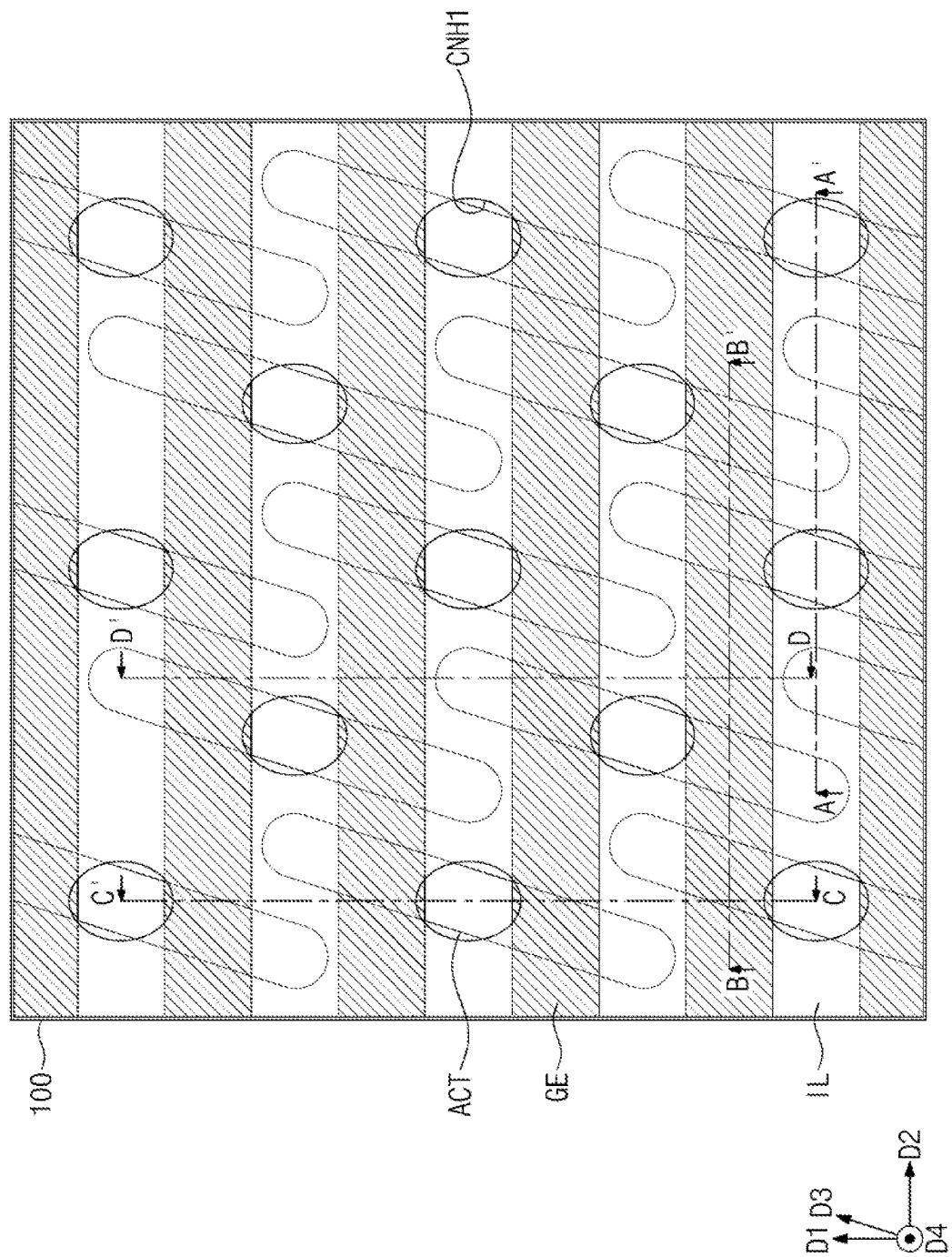
Figure 12A:
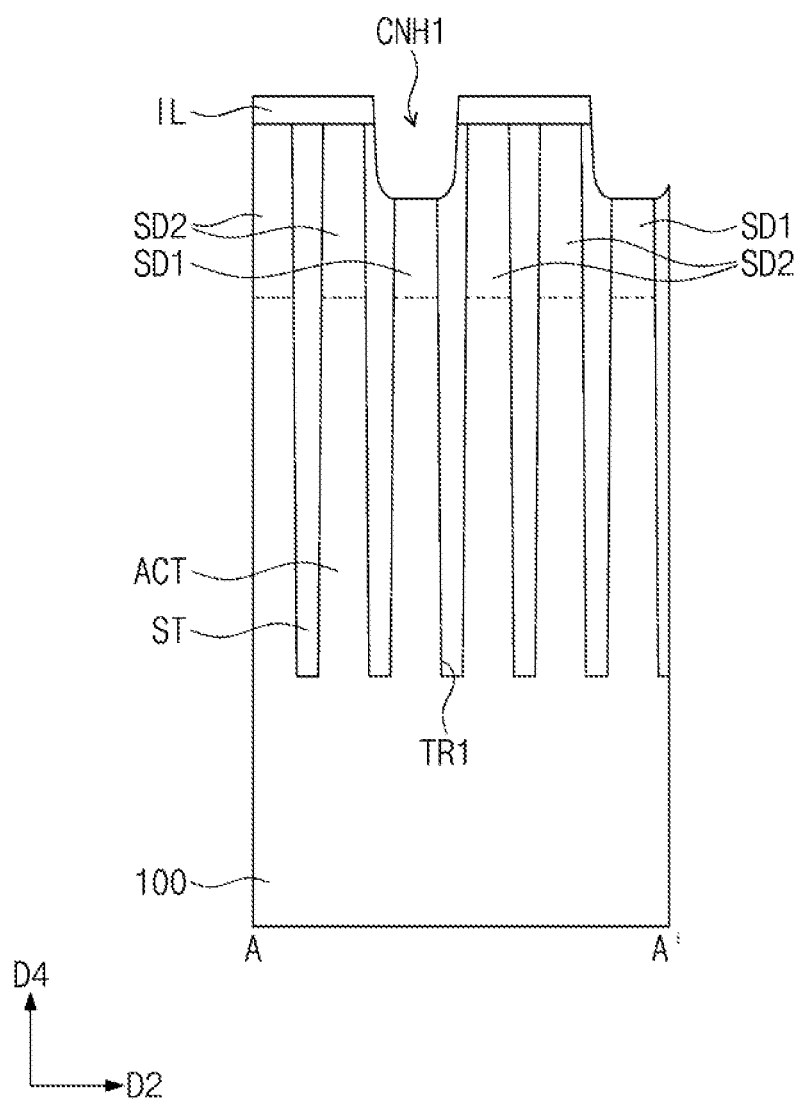
Figure 12B:
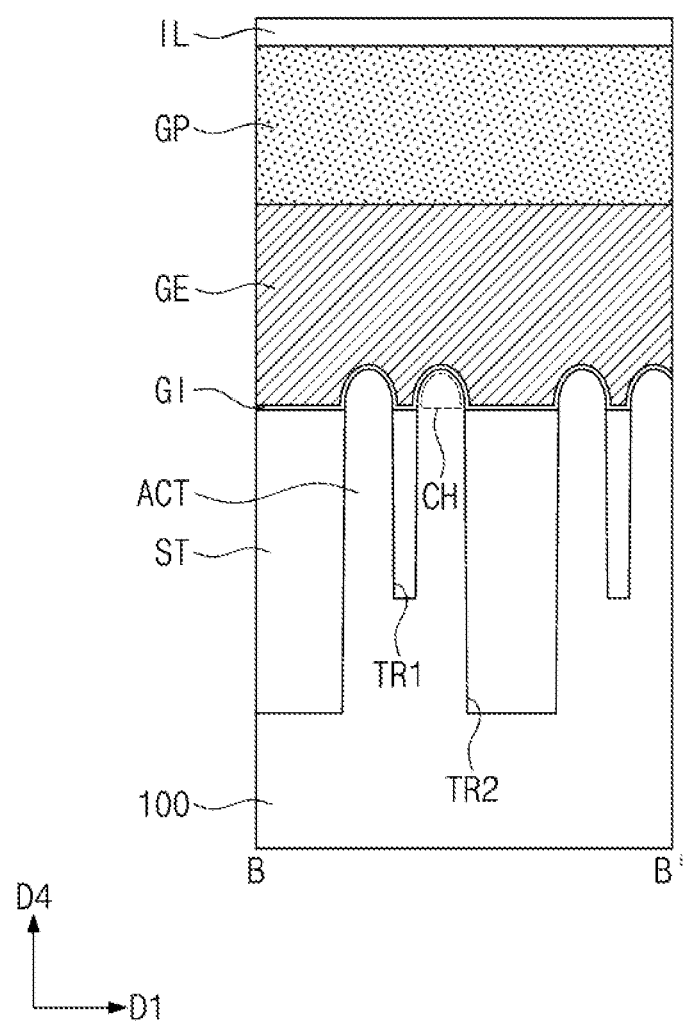
Figure 12C:
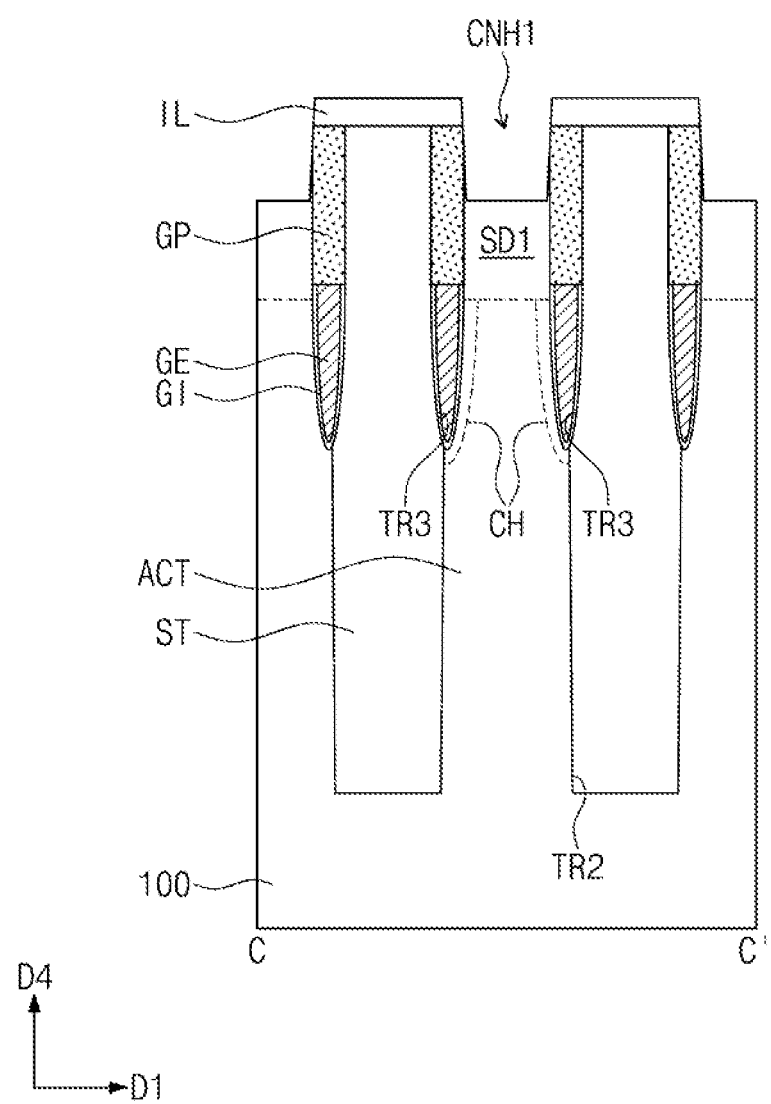
Figure 12D:
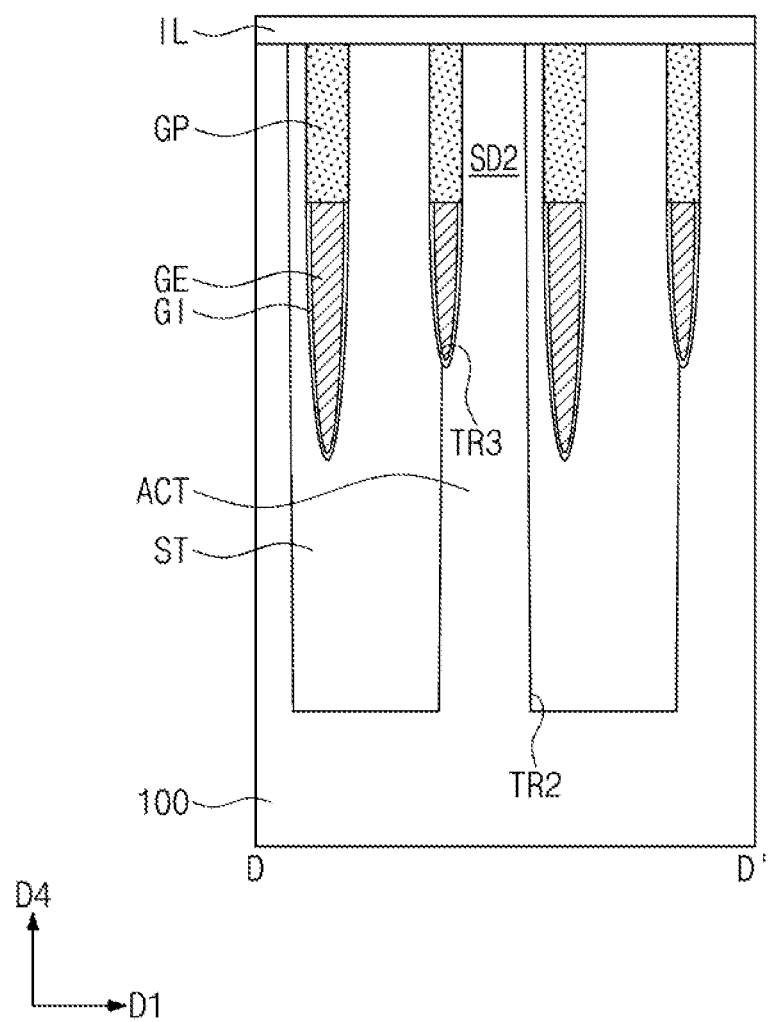
Figure 13:
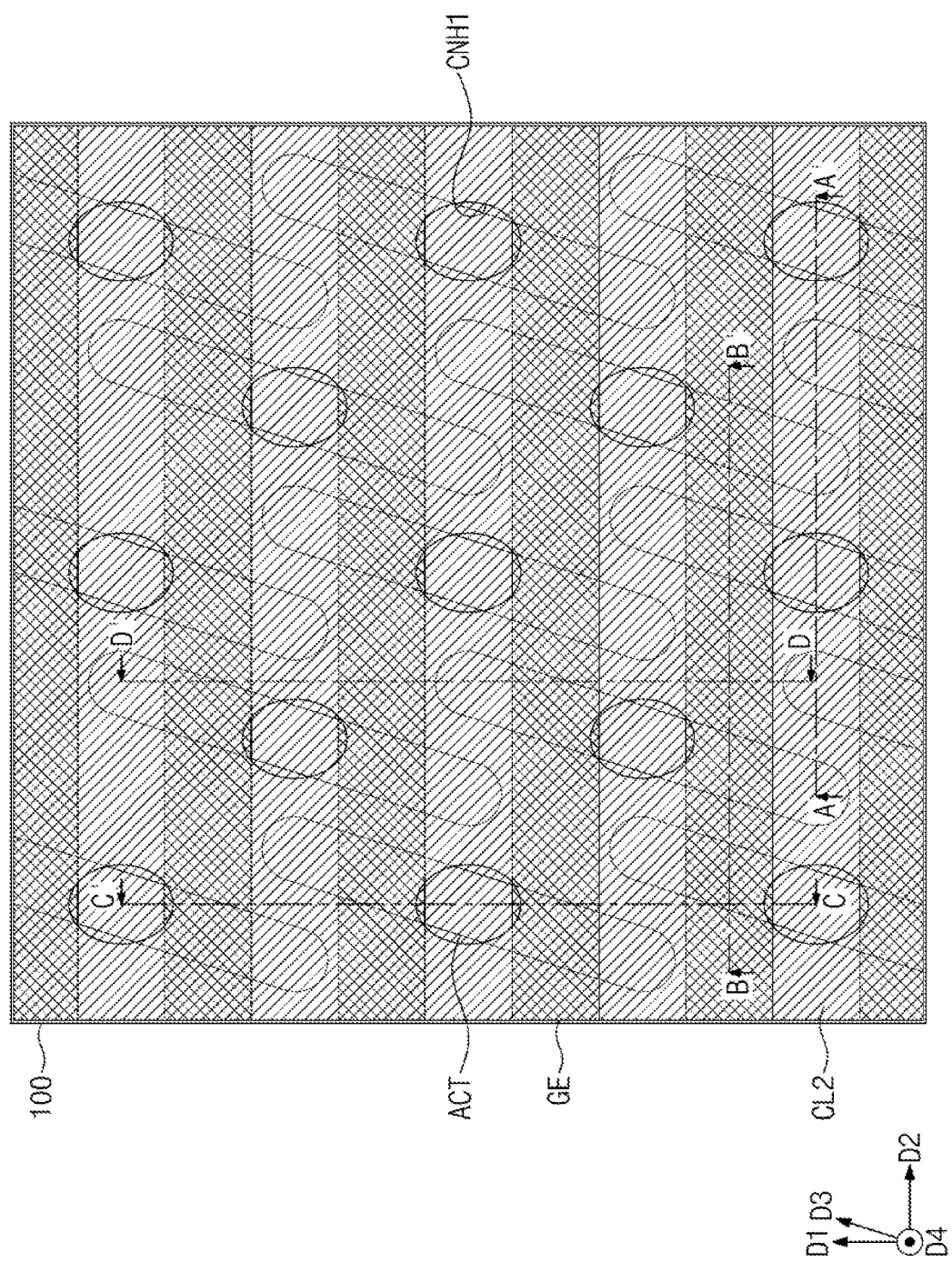
Figure 14A:
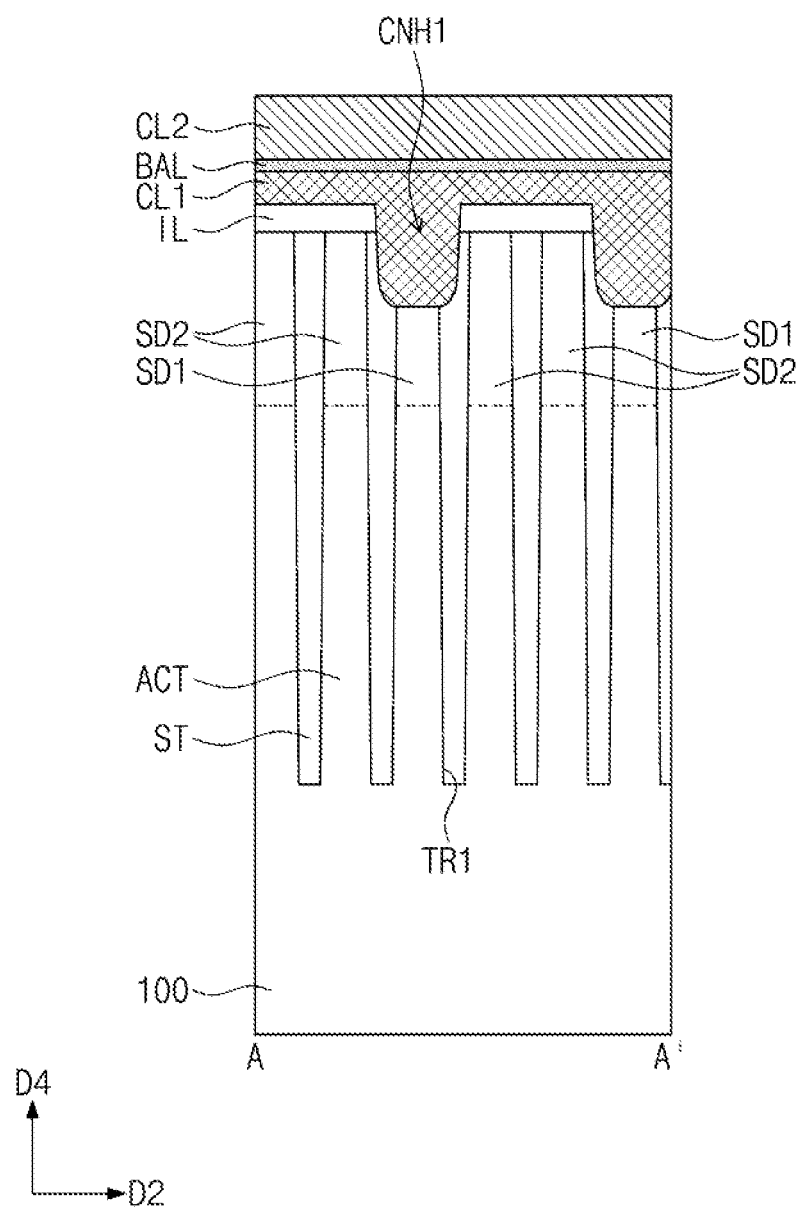
Figure 14B:
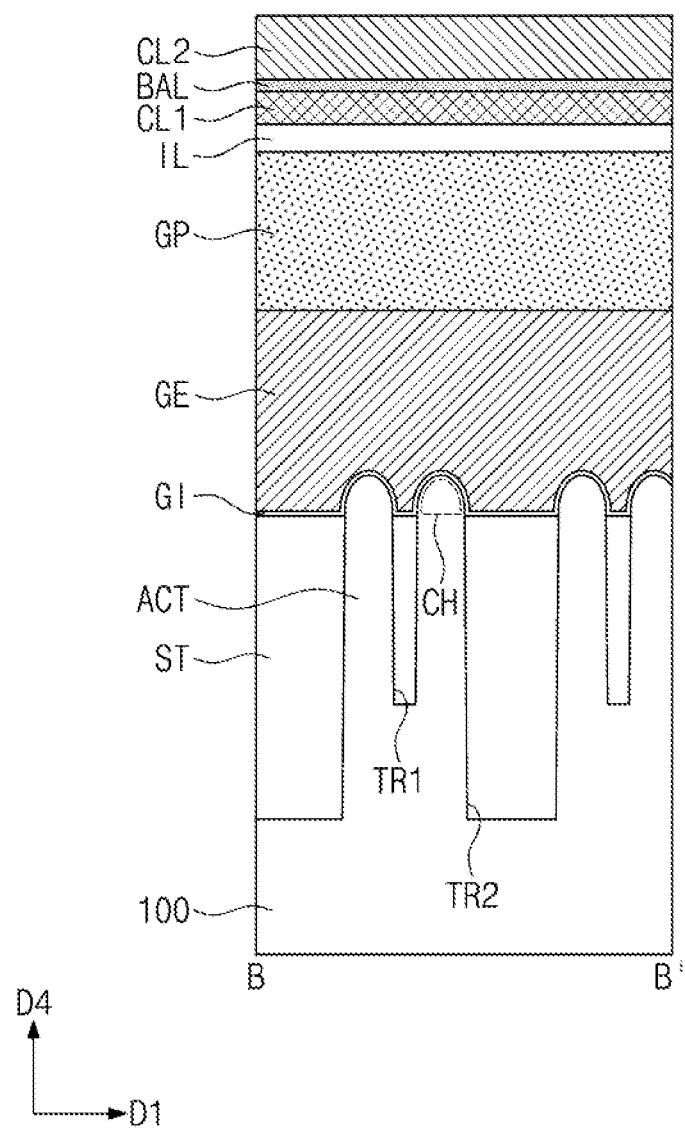
Figure 14C:
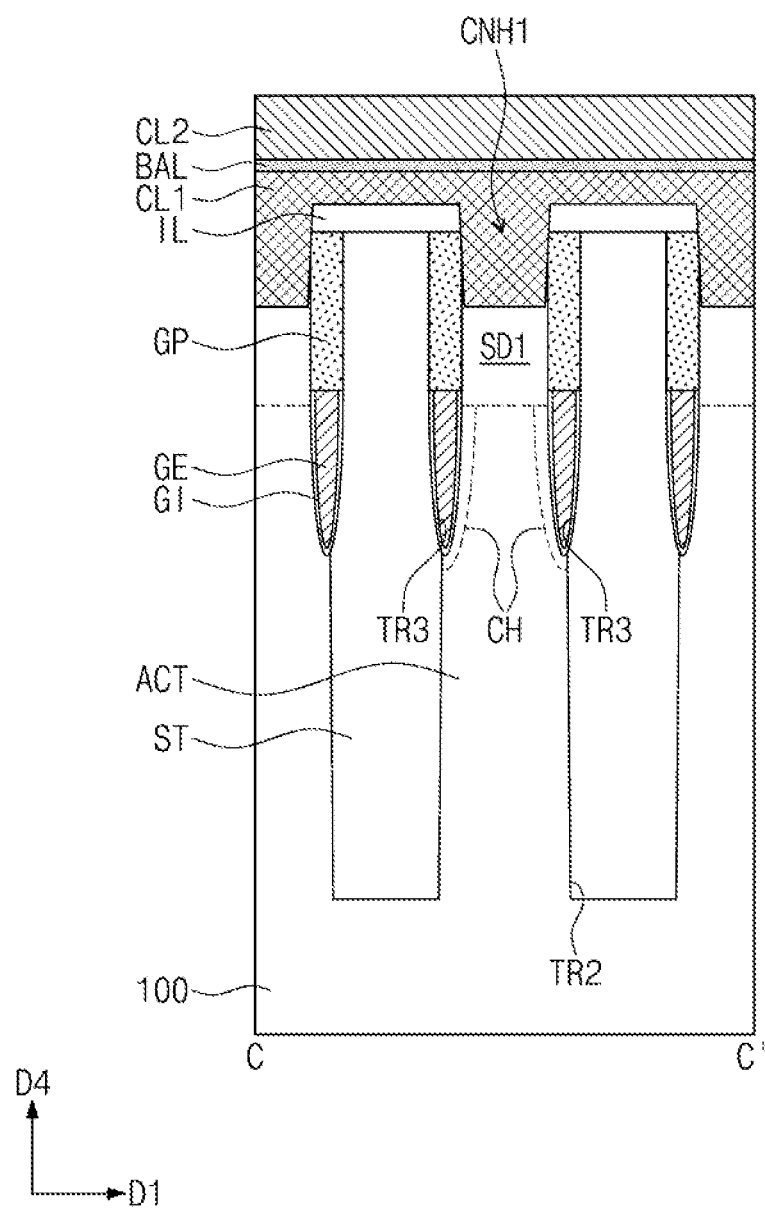
Figure 14D:
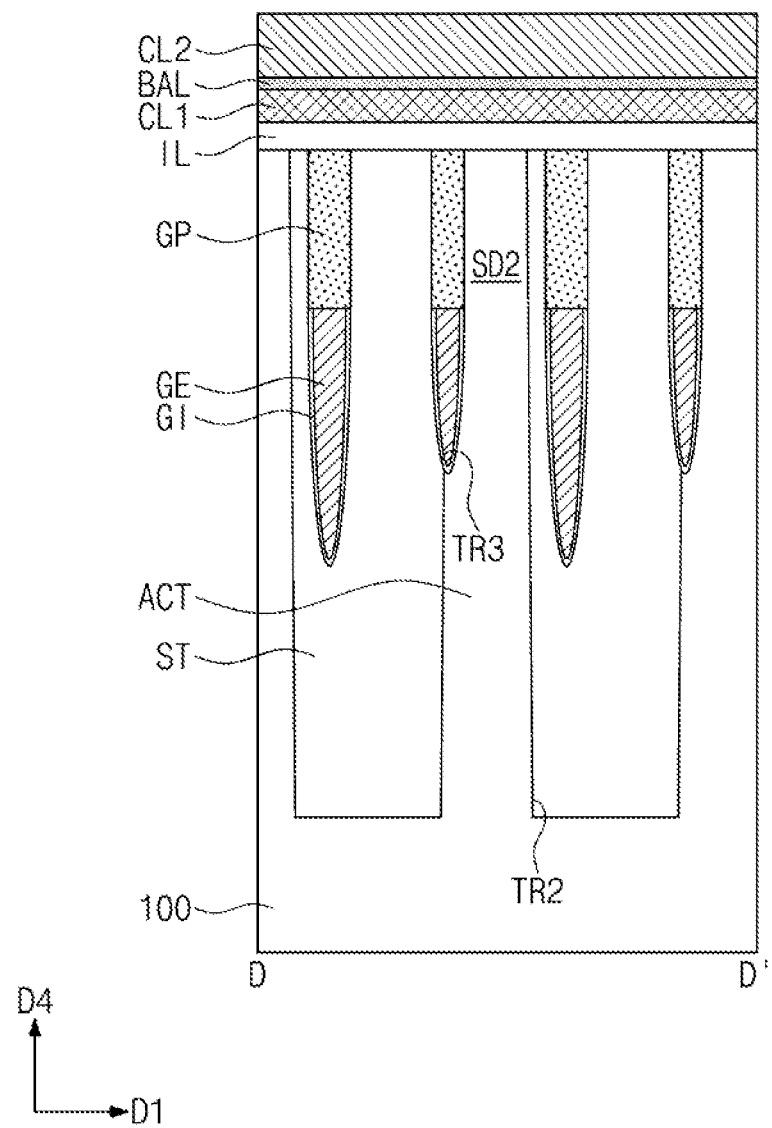
Figure 15:
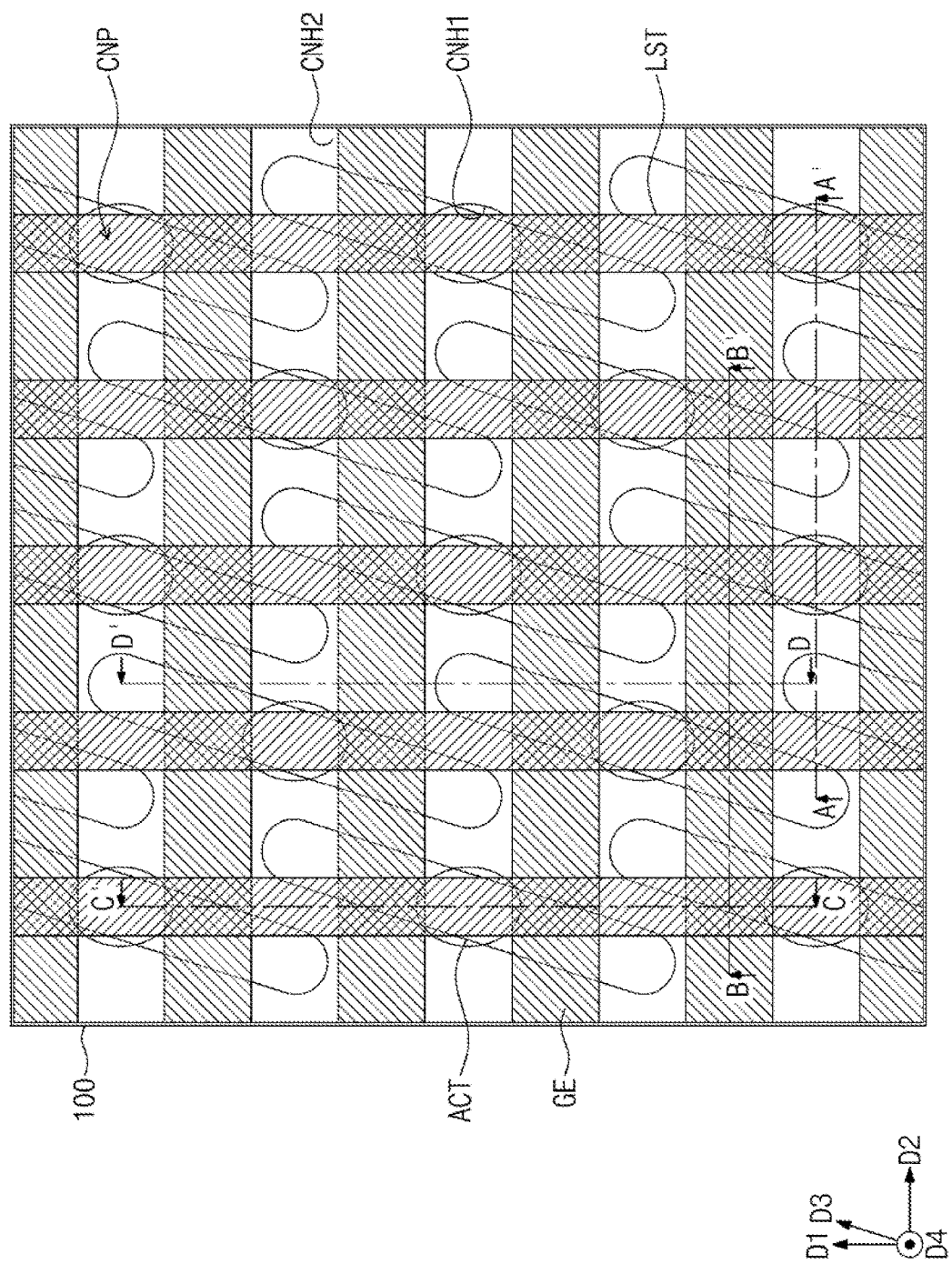
Figure 16A:
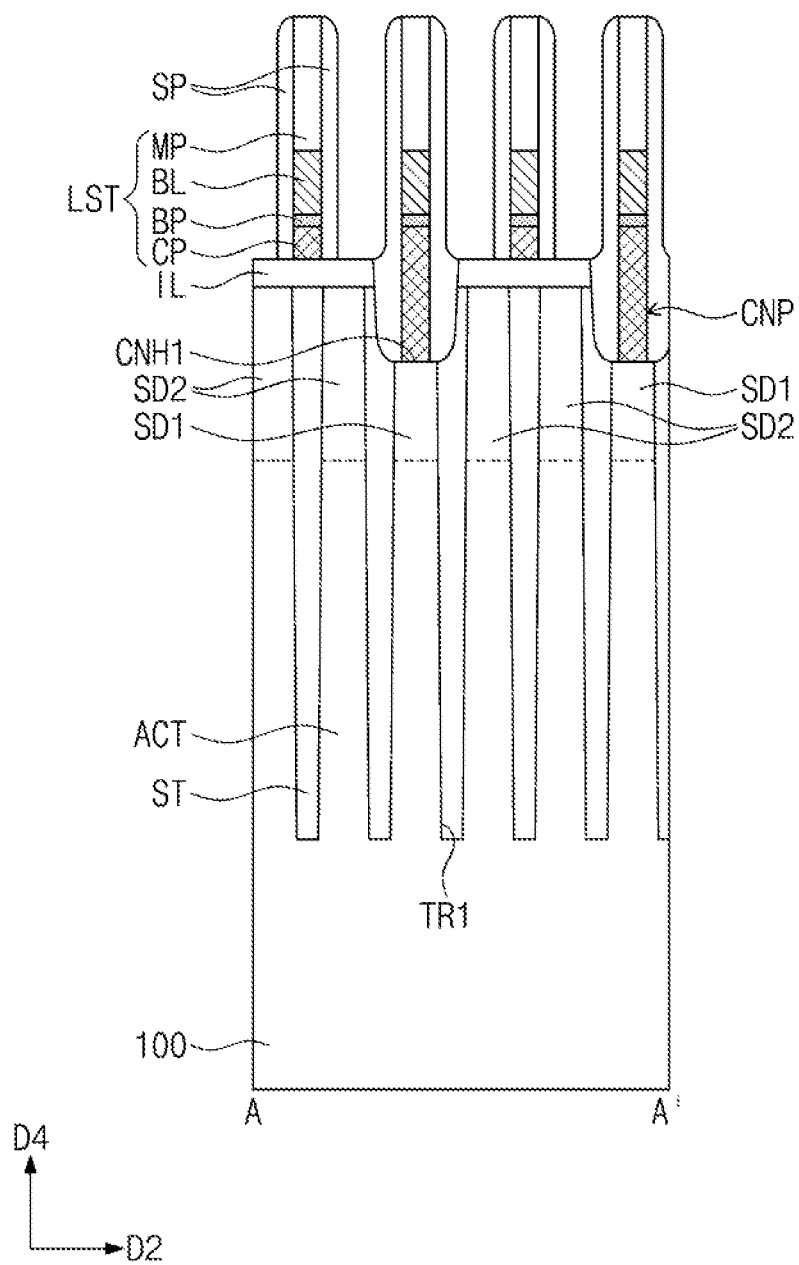
Figure 16B:
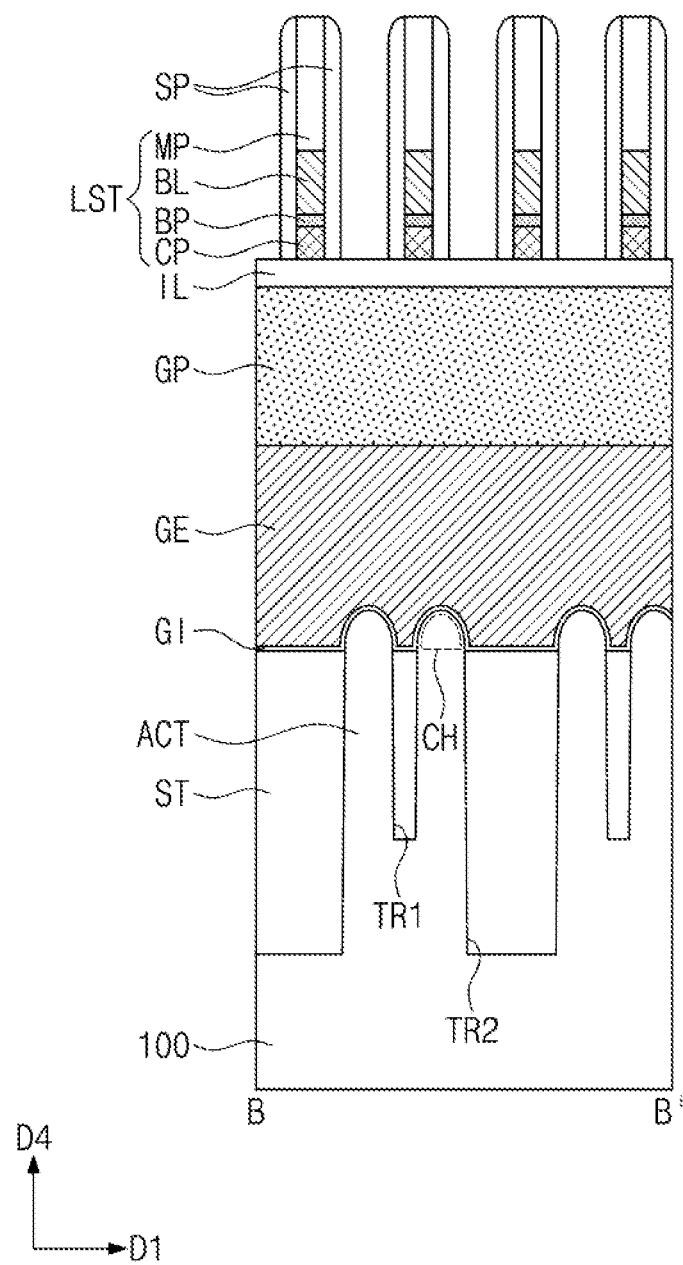
Figure 16C:
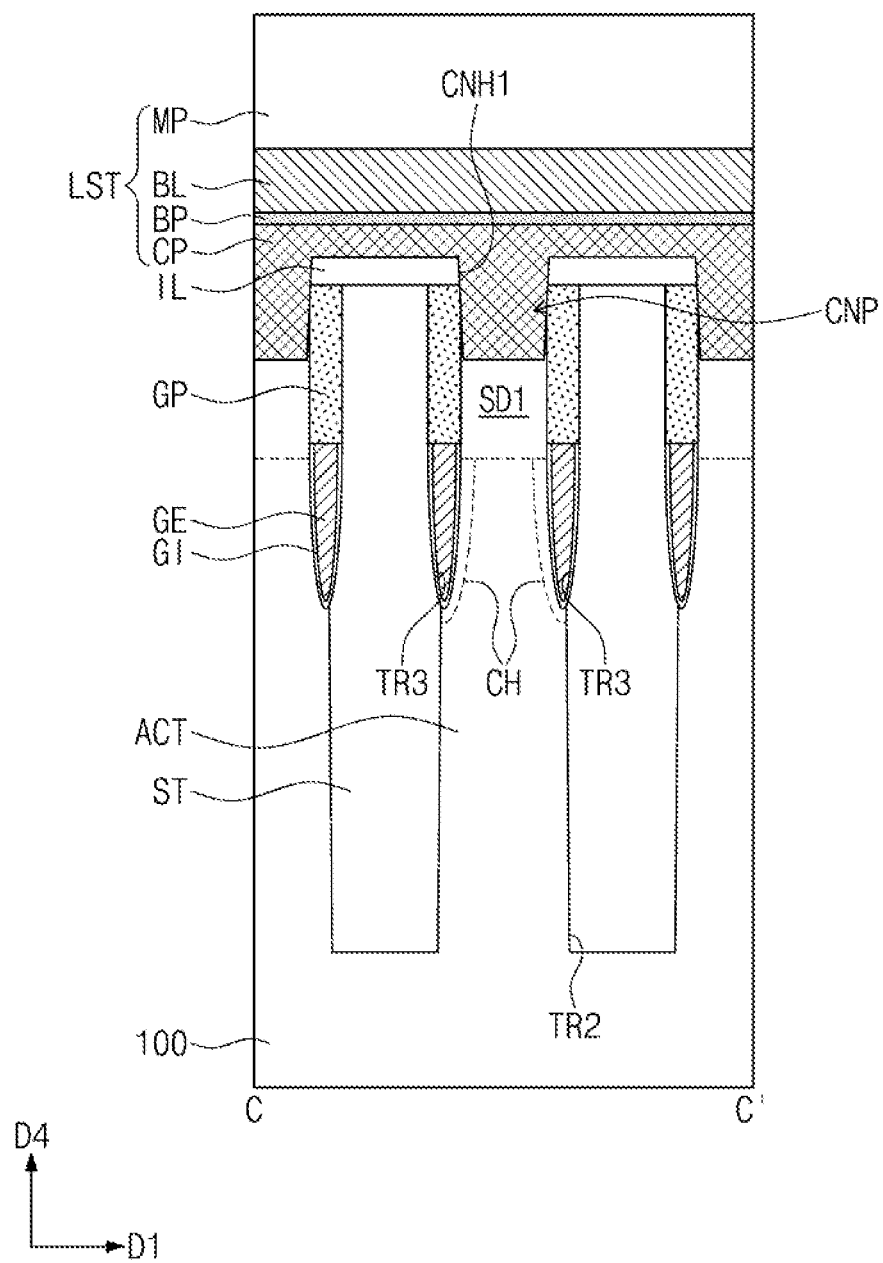
Figure 16D:
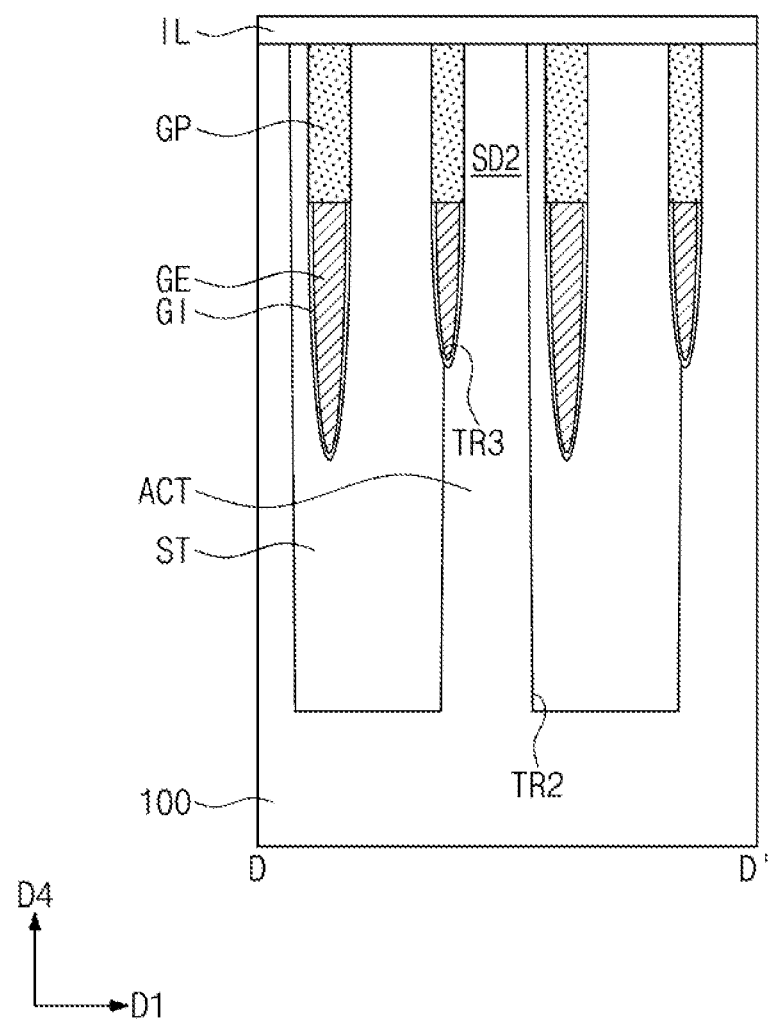
Figure 17:
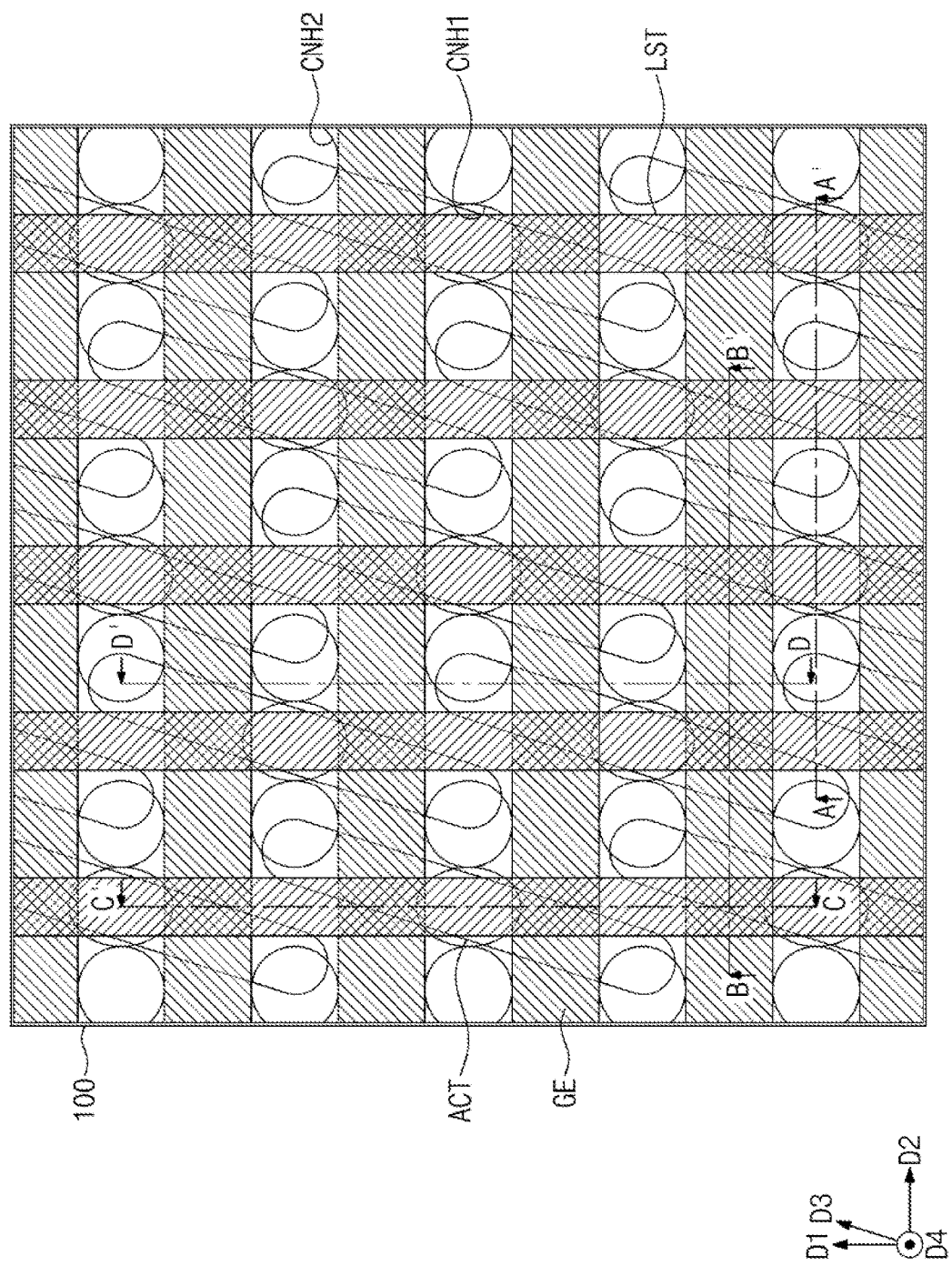
Figure 18A:
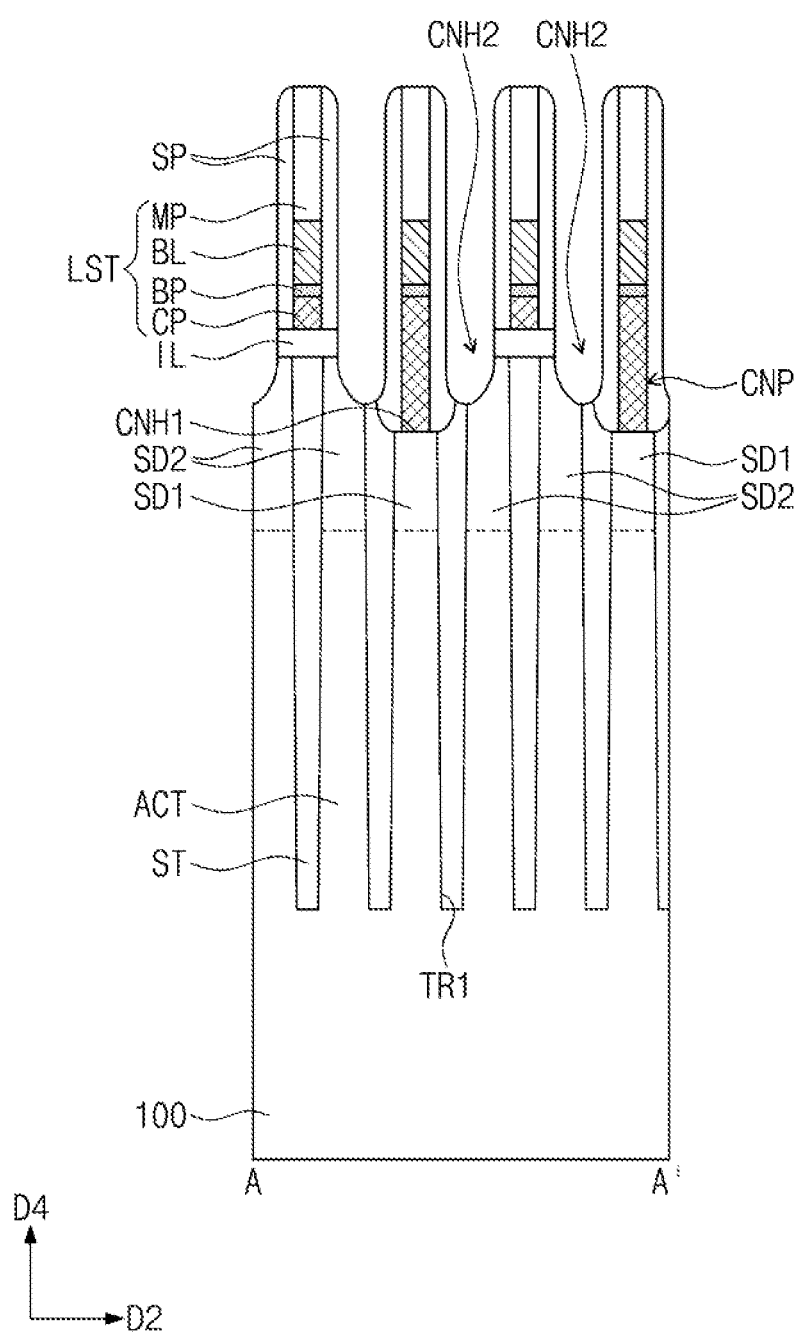
Figure 18B:
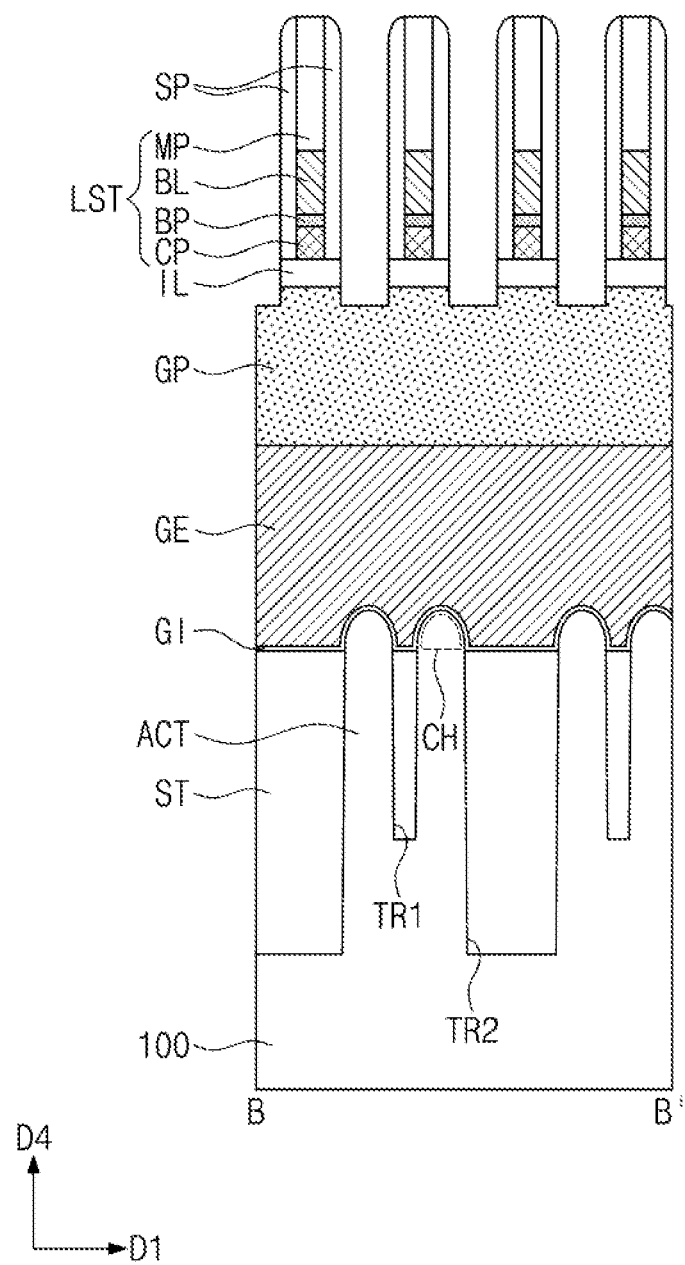
Figure 18C:
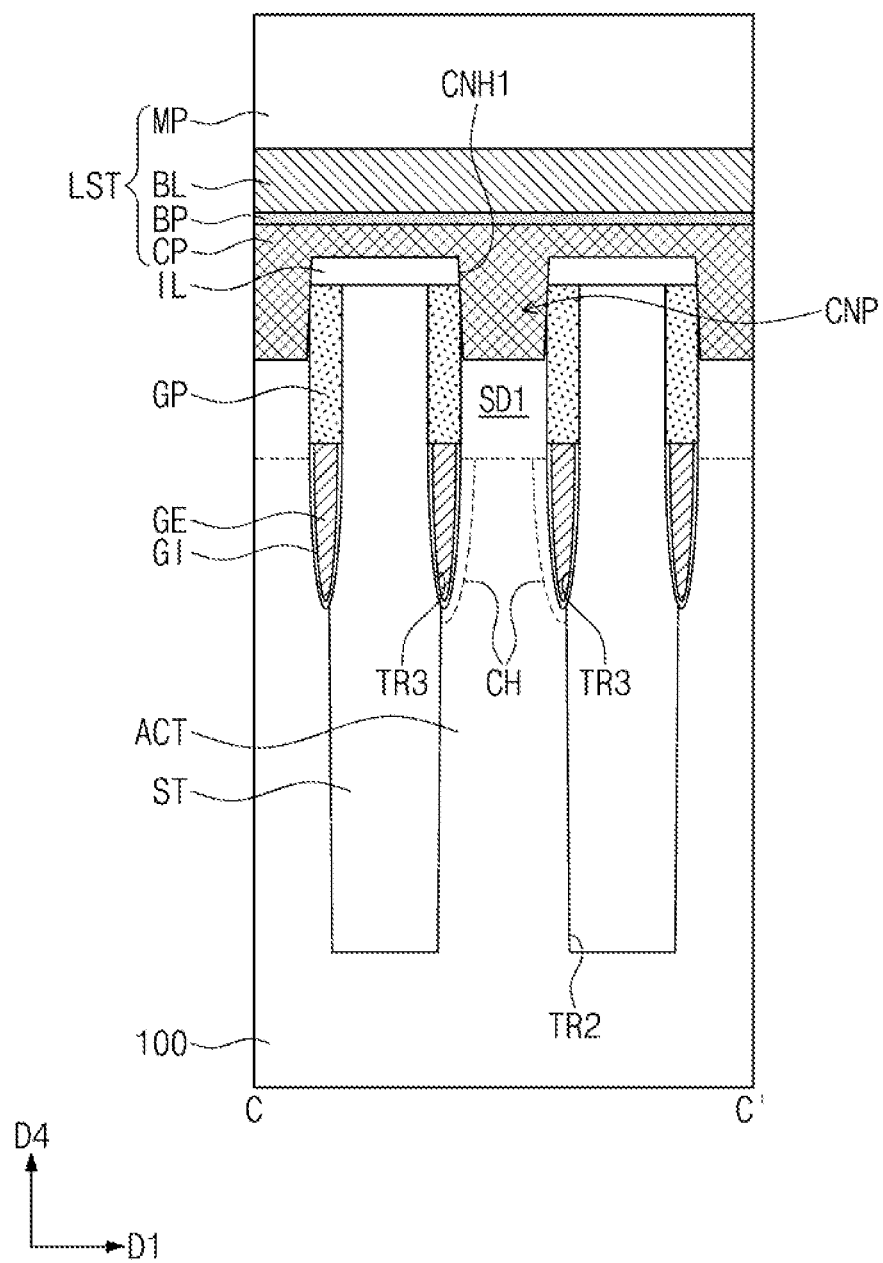
Figure 18D:
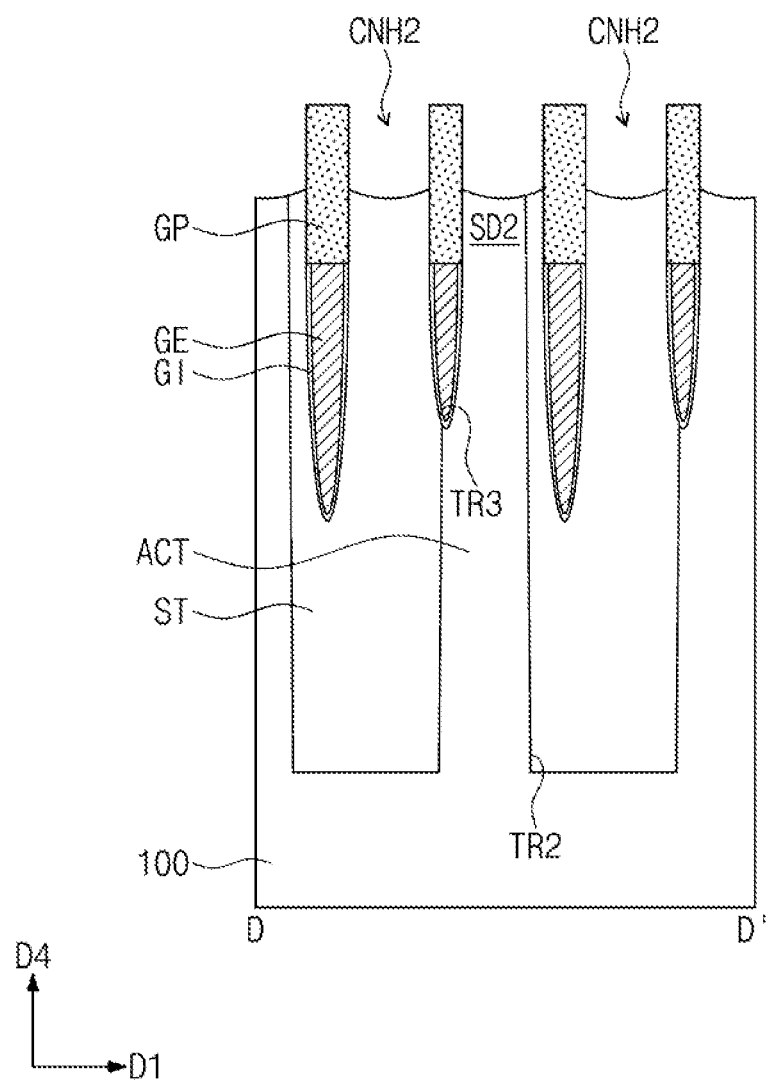
Figure 19:
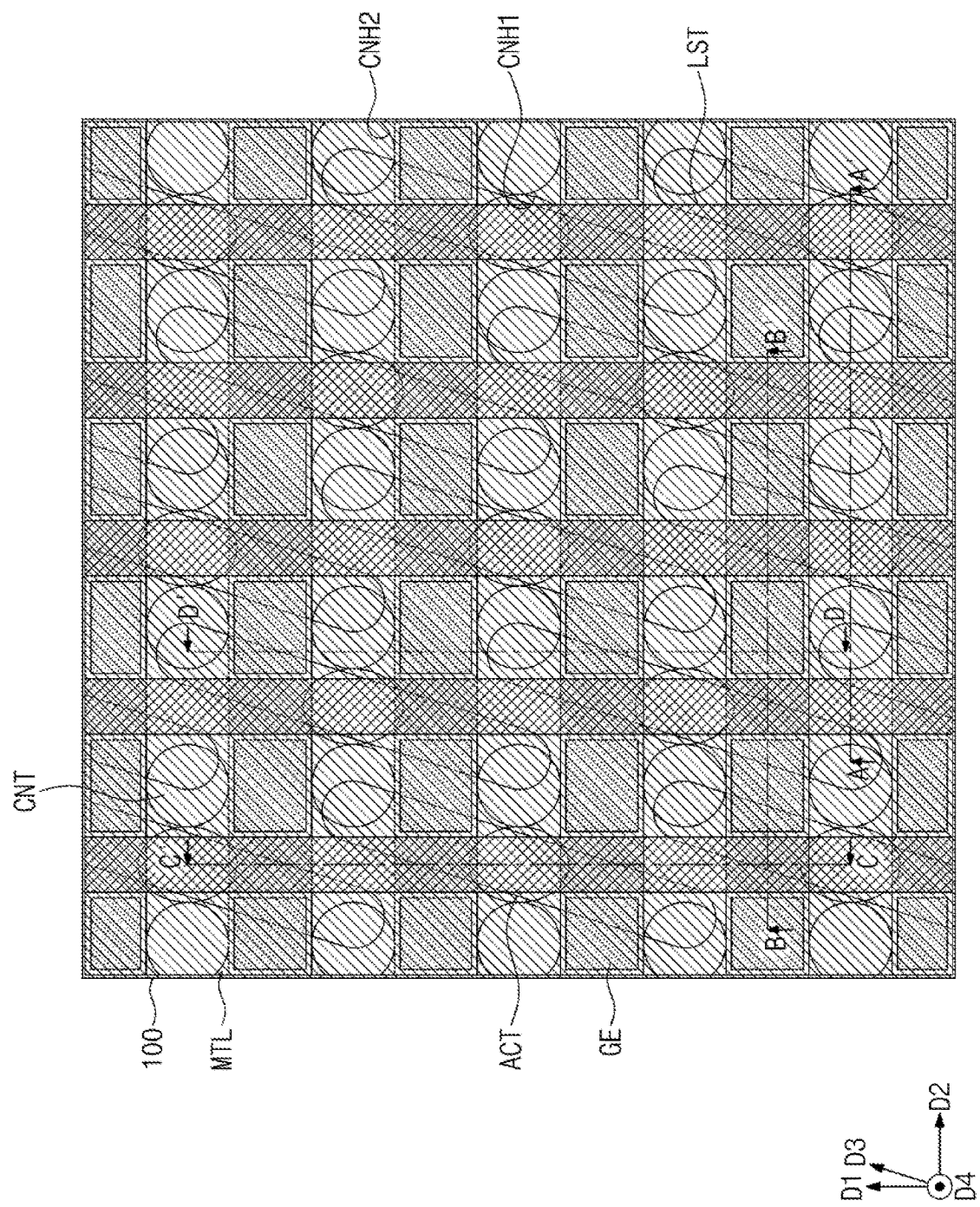
Figure 20A:
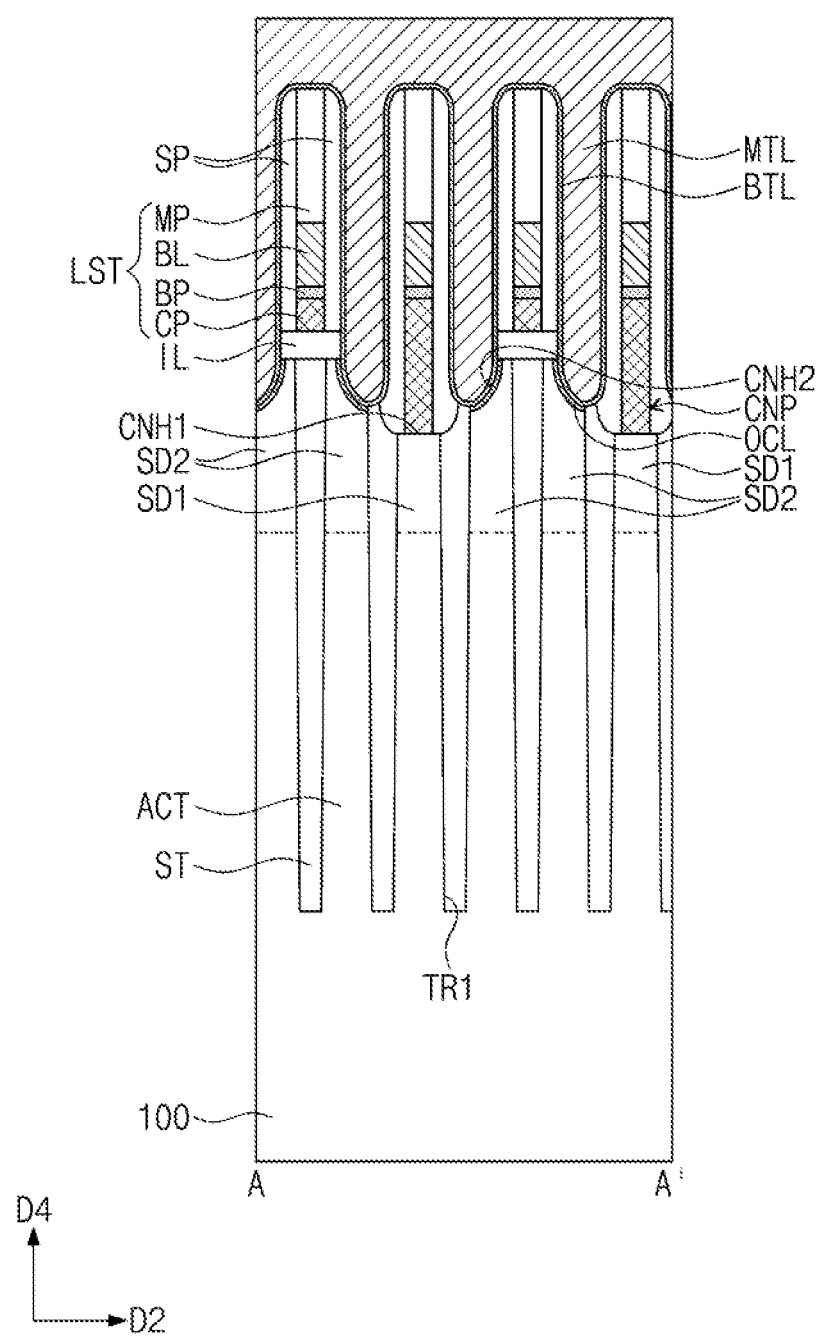
Figure 20B:
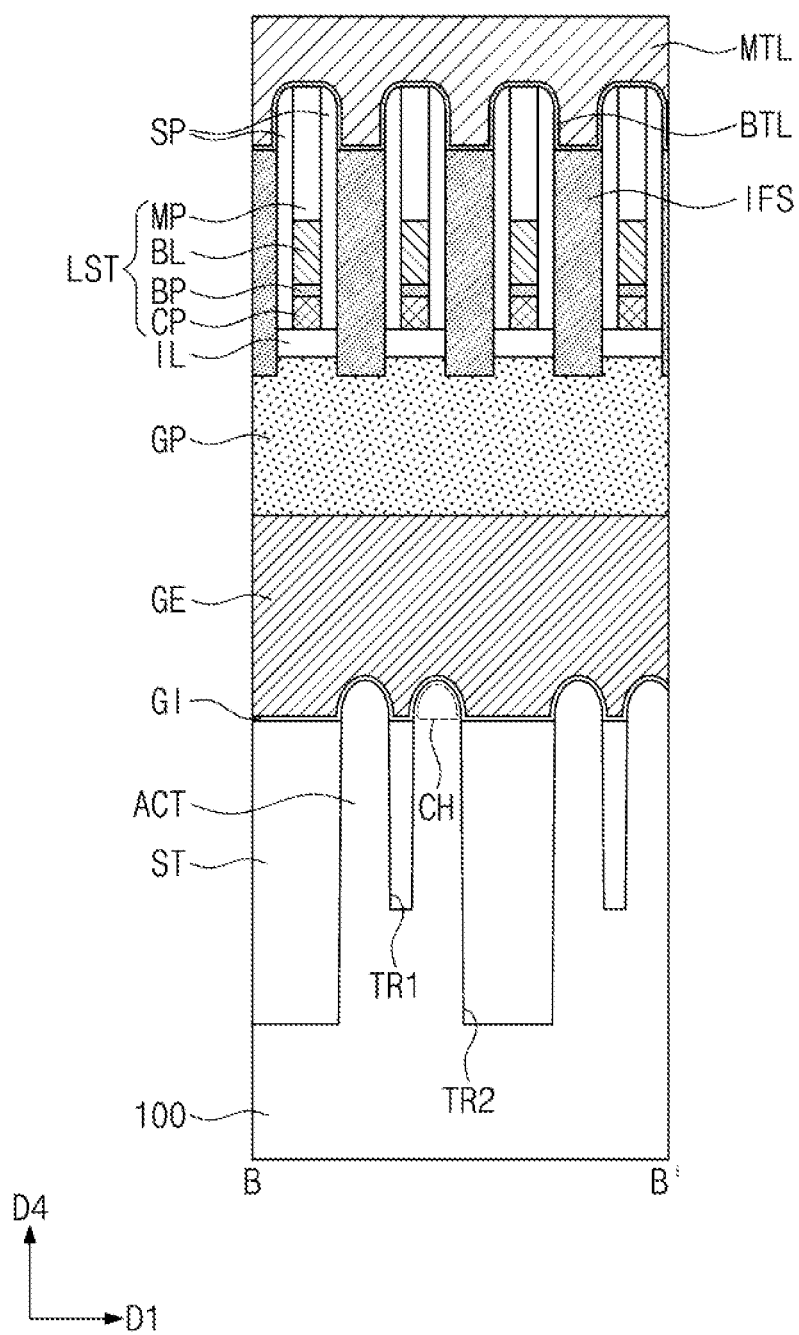
Figure 20C:
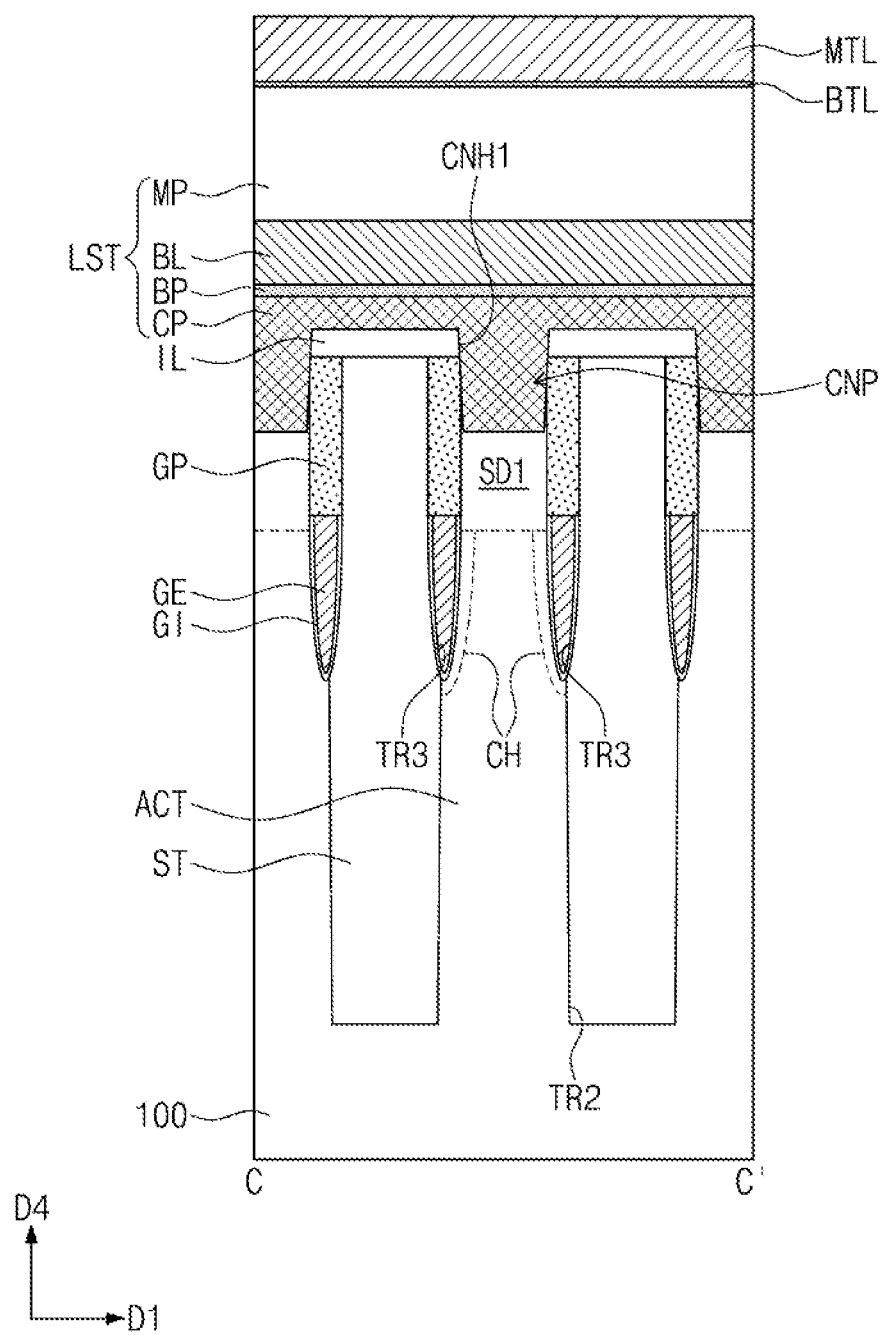
Figure 20D:
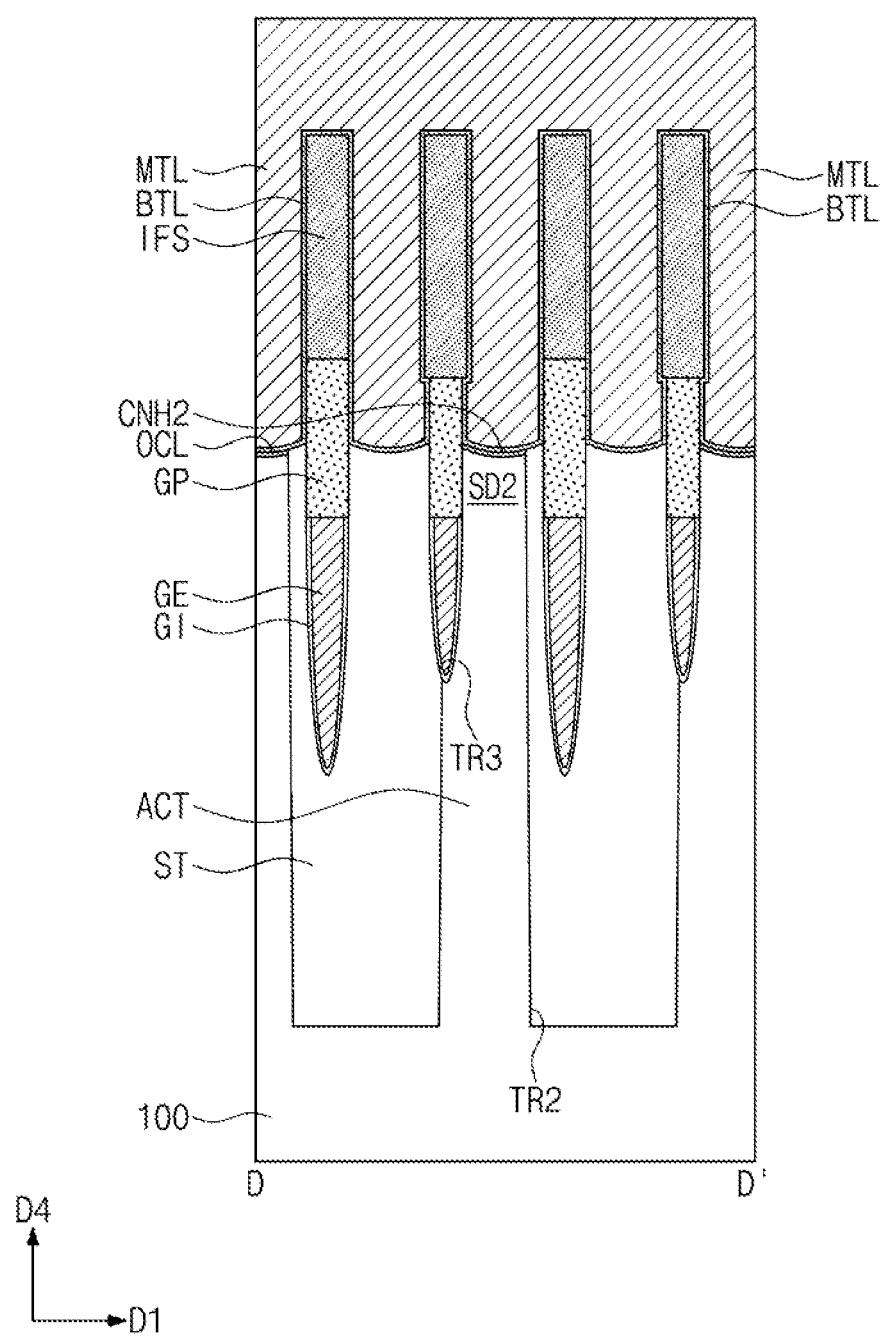

FIG. 4 is a perspective view illustrating another example of the contact of FIG. 3 according to an embodiment of the present inventive concept. In the present embodiment, the descriptions to the same technical features as in the embodiments of FIGS. 1 to 3 will be omitted for the purpose of ease and convenience in explanation. In other words, differences between the present embodiment and the embodiments of FIGS. 1 to 3 will be mainly described hereinafter.

Referring to FIG. 4, a contact CNT may be formed of a single metal pattern without distinction between the first metal pattern BOP and the second metal pattern BAP, unlike FIG. 3. The interface layer OCL may surround a surface of the contact CNT. The interface layer OCL may be disposed between the second source/drain region SD2 and the contact CNT. In other words, the contact CNT may be connected to the second source/drain region SD2 through the interface layer OCL. For example, the contact CNT may include a metal material (e.g., titanium (Ti), tantalum (Ta), tungsten (W), copper (Cu), or aluminum (Al)) or a conductive metal nitride (e.g., titanium nitride (TiN) or tantalum nitride (TaN)). According to the present embodiment, the metal of the contact CNT and the semiconductor of the second source/drain region SD2 may be connected to each other in the form of the ohmic contact using the interface layer OCL (e.g., graphene). Thus, a resistance of the buried contact may be relatively reduced. Accordingly, a planar size of the contact CNT may be reduced due to the reduction in resistance of the contact CNT, and thus the semiconductor memory device may be highly integrated.

FIGS. 5, 7, 9, 11, 13, 15, 17 and 19 are plan views illustrating a method for manufacturing a semiconductor memory device according to an embodiment of the present inventive concept. FIGS. 6A, 8A, 10A, 12A, 14A, 16A, 18A and 20A are cross-sectional views taken along lines A-A' of FIGS. 5, 7, 9, 11, 13, 15, 17 and 19, respectively. FIGS. 6B, 8B, 10B, 12B, 14B, 16B, 18B and 20B are cross-sectional views taken along lines B-B' of FIGS. 5, 7, 9, 11, 13, 15, 17 and 19, respectively. FIGS. 6C, 8C, 10C, 12C, 14C, 16C, 18C and 20C are cross-sectional views taken along lines C-C' of FIGS. 5, 7, 9, 11, 13, 15, 17 and 19, respectively. FIGS. 6D, 8D, 10D, 12D, 14D, 16D, 18D and 20D are cross-sectional views taken along lines D-D' of FIGS. 5, 7, 9, 11, 13, 15, 17 and 19, respectively.

Referring to FIGS. 5 and 6A to 6D, an upper portion of a substrate 100 may be patterned to form active patterns ACT. Each of the active patterns ACT may extend in a third direction D3 parallel to a top surface of the substrate 100. In other words, each of the active patterns ACT may have an isolated bar shape with a long axis in the third direction D3 when viewed in a plan view. The active patterns ACT may be two-dimensionally arranged in a first direction D1 and a second direction D2. Some of the active patterns ACT may be spaced apart from each other in the third direction D3.

First and second trenches TR1 and TR2 may be defined between the active patterns ACT. For example, the first and second trenches TR1 and TR2 may be formed by removing an upper portion of the substrate 100 through an anisotropic etching process. The first trench TR1 may be defined between a pair of the active patterns ACT adjacent to each other in the second direction D2. The second trench TR2 may be defined between a pair of the active patterns ACT adjacent to each other in the third direction D3.

A device isolation layer ST may be formed in the first and second trenches TR1 and TR2. The device isolation layer ST may completely fill the first and second trenches TR1 and TR2 and may cover the active patterns ACT. A planarization process may be performed on the device isolation layer ST until top surfaces of the active patterns ACT are exposed. For example, the top surface of the device isolation layer ST may be planarized using a chemical mechanical planarization (CMP) process or the like.

Referring to FIGS. 7 and 8A to 8D, the active patterns ACT and the device isolation layer ST may be patterned to form third trenches TR3. Each of the third trenches TR3 may have a line shape extending in the second direction D2 when viewed in a plan view.

The formation of the third trenches TR3 may include forming a hard mask pattern including openings, and etching the active patterns ACT and the device isolation layer ST, which are exposed through the openings, by using the hard mask pattern as an etch mask. The third trench TR3 may be formed to be shallower than the first trench TR1. When the third trenches TR3 are formed, an etching condition of the active patterns ACT and the device isolation layer ST may be properly controlled such that the device isolation layer ST may be more etched than the active patterns ACT. Therefore, the third trenches TR3 may have uneven bottoms. For example, the bottoms of the third trenches TR3 may be deeper on the device isolation layer ST and shallower on the active patterns ACT (see FIG. 8D).

Referring to FIGS. 9 and 10A to 10D, a gate dielectric layer GI, a gate electrode GE and a gate capping layer GP may be sequentially formed in each of the third trenches TR3. In detail, the gate dielectric layer GI may be conformally formed in the third trench TR3. The gate dielectric layer GI may be formed by, for example, a thermal oxidation process, a chemical vapor deposition (CVD) process, and/or an atomic layer deposition (ALD) process. For example, the gate dielectric layer GI may include a silicon oxide ($SiO_2$) layer, a silicon nitride ($Si_3N_4$) layer, a silicon oxynitride (SiON) layer, and/or a high-k dielectric layer.

A conductive layer filling the third trench TR3 may be formed on the gate dielectric layer GI to form the gate electrode GE. The conductive layer may include a conductive metal nitride and/or a metal material.

The gate dielectric layer GI and the gate electrode GE may be recessed, and the gate capping layer GP may be formed on the recessed gate electrode GE. The gate capping layer GP may include an insulation layer such as, for example, a silicon nitride ($Si_3N_4$) layer. A top surface of the gate capping layer GP may be substantially coplanar with the top surface of the active pattern ACT.

An ion implantation process may be performed on the active patterns ACT to form a first source/drain region SD1 and a pair of second source/drain regions SD2 in an upper portion of each of the active patterns ACT. For example, the gate capping layer GP and the device isolation layer ST may be used as a mask to dope impurities into the upper portions the active patterns ACT, which may then form the first and second source/drain regions SD1 and SD2. The pair of second source/drain regions SD2 may be spaced apart from each other in the third direction D3 with the first source/drain region SD1 interposed therebetween. For example, the first and second source/drain regions SD1 and SD2 may be doped with the same dopants.

According to an embodiment of the present inventive concept, the first and second source/drain regions SD1 and SD2 may be formed in the active pattern ACT by an ion implantation process. Thus, doping profiles of the first and second source/drain regions SD1 and SD2 may be substantially constant. As a result, according to the present inventive concept, a gate induced drain leakage (GIDL) caused by doping dispersion of source/drain regions may be inhibited or prevented.

A channel region CH may be defined in the active pattern ACT located under the gate electrode GE. The channel region CH may be disposed between the first source/drain region SD1 and the second source/drain region SD2 when viewed in a plan view. The gate electrode GE may be provided on a top surface and both sidewalls of the channel region CH (see FIG. 10B). Thus, the channel region CH may be lower than the first and second source/drain regions SD1 and SD2 (see FIG. 10C).

Referring to FIGS. 11 and 12A to 12D, an insulating layer IL may be formed on an entire top surface of the substrate 100. Thus, the insulating layer IL may be formed on top surfaces of the active pattern ACT, the device isolation layer ST, and the gate capping layer GP. For example, the insulating layer IL may have a multi-layered structure in which a silicon oxide ($SiO_2$) layer and a silicon oxynitride (SiON) layer are stacked. The insulating layer IL may be patterned to form first contact holes CNH1 exposing the first source/drain regions SD1 of the active patterns ACT, respectively. A photolithography process and an etching process may be used to pattern the insulating layer IL and to form the first contact holes CNH1. The first contact holes CNH1 may be formed to have island shapes spaced apart from each other when viewed in a plan view, and each may be formed at the central portion of each of the active patterns ACT (see FIG. 11). When the first contact hole CNH1 is formed, an upper portion of the first source/drain region SD1 may be recessed, and an upper portion of the device isolation layer ST around the first source/drain region SD1 may also be recessed.

Referring to FIGS. 13 and 14A to 14D, a first conductive layer CL1, a barrier layer BAL and a second conductive layer CL2 may be sequentially formed on the insulating layer IL. The first conductive layer CL1 may fill the first contact holes CNH1. In other words, the first conductive layer CL1 may be in contact with the first source/drain regions SD1 of the active patterns ACT. The first conductive layer CL1 may be vertically spaced apart from the second source/drain regions SD2 of the active patterns ACT by the insulating layer IL. The first conductive layer CL1 may include a doped semiconductor material. In an embodiment of the present inventive concept, the first conductive layer CL1 may include a doped polysilicon (p-Si).

The barrier layer BAL may be disposed between the first conductive layer

CL1 and the second conductive layer CL2. The barrier layer BAL may include a conductive metal nitride. The second conductive layer CL2 may include a metal material. The barrier layer BAL may inhibit or prevent the metal material in the second conductive layer CL2 from being diffused into the first conductive layer CL1.

Referring to FIGS. 15 and 16A to 16D, line structures LST extending in the first direction D1 in parallel to each other may be formed on the insulating layer IL. The line structures LST may be arranged in the second direction D2.

In detail, mask patterns MP may be formed on the second conductive layer CL2. The mask patterns MP may have line shapes extending in the first direction D1. For example, the mask patterns MP may include silicon nitride ($Si_3N_4$) or silicon oxynitride (SiON). A photolithography process and an etching process may be used to form the mask patterns MP.

The second conductive layer CL2, the barrier layer BAL and the first conductive layer CL1 may be sequentially etched using the mask patterns MP as etch masks to form a bit line BL, a barrier pattern BP and a conductive pattern CP under each of the mask patterns MP. The etching process may partially expose a top surface of the insulating layer IL, and also partially expose an inner sidewall and a bottom surface of the first contact hole CNH1. The mask pattern MP, the bit line BL, the barrier pattern BP and the conductive pattern CP may vertically overlap with each other. The mask pattern MP, the bit line BL, the barrier pattern BP and the conductive pattern CP may constitute the line structure LST.

The bit lines BL may extend to intersect the gate electrodes GE, when viewed in a plan view. Also, the bit lines BL may extend to intersect the active patterns ACT, when viewed in a plan view.

The conductive pattern CP may include contact portions CNP filling the first contact holes CNH1, respectively. The conductive pattern CP may be connected to the first source/drain region SD1 through the contact portion CNP. In other words, the bit line BL may be electrically connected to the first source/drain region SD1 through the barrier pattern BP and the conductive pattern CP.

A pair of spacers SP may be formed on both sidewalls of each of the line structures LST, and may be formed of, for example, a silicon nitride ($Si_3N_4$) layer. The formation of the spacers SP may include conformally forming a spacer layer on the substrate 100 and anisotropically etching the spacer layer. The spacers SP may fill a remaining portion of the first contact hole CNH1 except the contact portion CNP.

Referring to FIGS. 17 and 18A to 18D, an anisotropic etching process may be performed on the substrate 100 using the spacers SP and the mask patterns MP as etch masks to form second contact holes CNH2 exposing the second source/drain regions SD2, respectively. The second contact holes CNH2 may be self-aligned using the spacers SP and the mask patterns MP. The insulating layer IL may be etched during the anisotropic etching process. An upper portion of the active pattern ACT and an upper portion of the device isolation layer ST may be etched by over-etching during the anisotropic etching process. The second contact holes CNH2 may be two-dimensionally arranged in the first direction D1 and the second direction D2. For example, the second contact holes CNH2 and the mask patterns MP may be alternately arranged in the second direction D2. The second contact holes CNH2 and the gate capping layer GP may be alternately arranged in the first direction D1. In an embodiment of the present inventive concept, the second contact holes CNH2 may be arranged in a matrix form.

The second contact hole CNH2 may penetrate the insulating layer IL and may extend downward to a level lower than the top surface of the substrate 100. An upper portion of the second source/drain region SD2 may be recessed by the second contact hole CNH2. An upper portion of the device isolation layer ST around the second source/drain region SD2 may also be recessed by the second contact hole CNH2. For example, the active pattern ACT, which includes the second source/drain region SD2, and the device isolation layer ST may be recessed to define the second contact hole CNH2. Additionally, a cleaning process and/or a surface treatment process may be performed on the second contact holes CNH2.

Referring to FIGS. 19 and 20A to 20D, a plurality of insulating fences IFS may be formed on the gate capping layer GP. For example, the insulating fences IFS may be arranged in the second direction D2 on the gate capping layer GP extending in the second direction D2. The insulating fences IFS may be formed between the line structures LST. For example, the insulating fences IFS and the line structures LST may be alternately arranged in the second direction D2. The insulating fences IFS may not overlap with the second contact holes CNH2 but may expose the second contact holes CNH2.

An interface layer OCL may be formed on a surface of the second source/drain region SD2, which is exposed through the second contact hole CNH2. In an embodiment of the present inventive concept, the interface layer OCL may be selectively formed on only the exposed surface of the second source/drain region SD2. In an embodiment of the present inventive concept, the interface layer OCL may be conformally formed on all layers exposed by the second contact hole CNH2 (see FIG. 21).

The interface layer OCL may be formed using a deposition process such as an ALD process or a CVD process. For example, the interface layer OCL may include graphene. For example, the interface layer OCL may include a metal silicide formed by reacting the surface of the second source/drain region SD2 with a metal.

A second metal layer BTL and a first metal layer MTL may be sequentially formed on an entire top surface of the substrate 100. The second metal layer BTL may be conformally formed by a deposition process. The first metal layer MTL may be formed to completely fill the second contact hole CNH2. The first metal layer MTL may cover all of the line structures LST. Thus, a top surface of the first metal layer MTL may be higher than a top surface of the line structure LST.

The first metal layer MTL may be formed of a metal material (e.g., titanium (Ti), tantalum (Ta), tungsten (W), copper (Cu), or aluminum (Al)). The second metal layer BTL may include a barrier layer for preventing diffusion of a metal element in the first metal layer MTL. The second metal layer BTL may be formed of a conductive metal nitride (e.g., titanium nitride (TiN) or tantalum nitride (TaN)).

Referring again to FIGS. 1 and 2A to 2D, the first metal layer MTL and the second metal layer BTL may be patterned to form a recess exposing the insulating fences IFS. For example, the recess may divide the first metal layer MTL and the second metal layer BTL to a plurality of isolated structures, and may surround the pad portions PAP of the contacts CNT. An insulating pattern INP may be formed to fill the recess. The first metal layer MTL and the second metal layer BTL may be patterned to form a plurality of contacts CNT. Adjacent contacts CNT may be separated from each other by the insulating fence IFS and the insulating pattern INP. For example, the contacts CNT may be alternately arranged in the second direction D2 with the line structures LST and the insulating pattern INP, and may be alternately arranged in the first direction D1 with the insulating fences IFS and the insulating pattern INP.

First electrodes LEL may be formed on the pad portions PAP of the contacts CNT, respectively. A dielectric layer HDL may be conformally formed on the first electrodes LEL. A second electrode TEL may be formed on the dielectric layer HDL, such that the dielectric layer HDL may be interposed between the second electrode TEL and the first electrodes LEL. The first electrode LEL, the dielectric layer HDL and the second electrode TEL may constitute a data storage element DS, e.g., a capacitor. In addition, stacked interconnection layers may be formed on the second electrode TEL.

Figure 21:
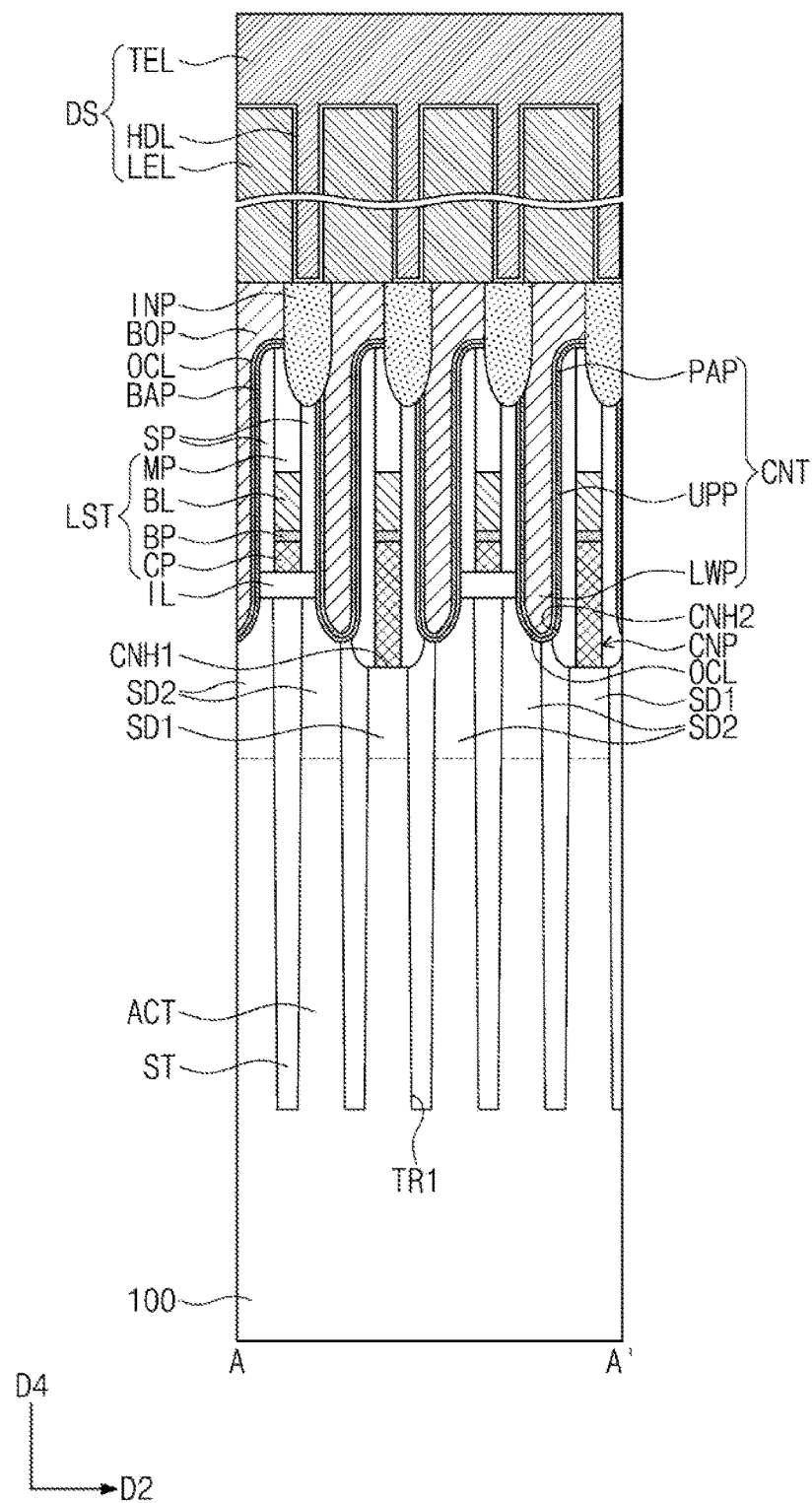
FIGS. 21 and 22 are cross-sectional views taken along line A-A' of FIG. 1 to illustrate semiconductor memory devices each according to an embodiment of the present inventive concept.
Figure 23:
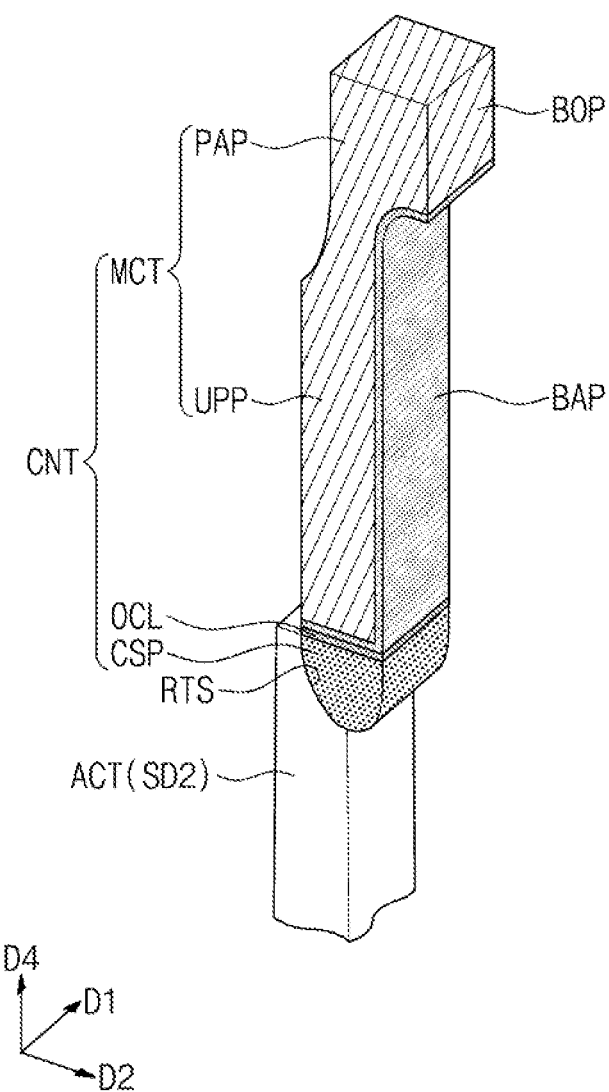
FIG. 23 is a perspective view illustrating a contact of FIG. 22.

FIGS. 21 and 22 are cross-sectional views taken along line A-A' of FIG. 1 to illustrate semiconductor memory devices each according to an embodiment of the present inventive concept. FIG. 23 is a perspective view illustrating a contact of FIG. 22. In the present embodiments, the descriptions to the same technical features as in the embodiments of FIGS. 1 to 3 will be omitted for the purpose of ease and convenience in explanation. In other words, differences between the present embodiments and the embodiments of FIGS. 1 to 3 will be mainly described hereinafter.

Referring to FIG. 21, in an embodiment of the present inventive concept, the interface layer OCL may surround a surface of the contact CNT. For example, the interface layer OCL may cover a surface of the spacer SP as well as the surface of the second source/drain region SD2. In other words, the interface layer OCL may conformally cover surfaces of layers exposed by the second contact hole CNH2.

The interface layer OCL may extend from the second source/drain region SD2 along the spacer SP in a vertical direction (i.e., the fourth direction D4). The interface layer OCL may cover a top surface of the spacer SP and at least a portion of a top surface of the mask pattern MP. The second metal pattern BAP and the first metal pattern BOP may be sequentially provided on the interface layer OCL. In the present embodiment, the contact CNT and the second source/drain region SD2 may be connected to each other in the form of the ohmic contact using the interface layer OCL (e.g., graphene). Thus, a resistance of the buried contact may be relatively reduced, and thus electrical characteristics of the device may be enhanced.

Referring to FIGS. 22 and 23, in an embodiment of the present inventive concept, a contact CNT may include a semiconductor pattern CSP, a metal contact MCT, and an interface layer OCL interposed between the semiconductor pattern CSP and the metal contact MCT. The semiconductor pattern CSP may be provided in the second contact hole CNH2 and may be in direct contact with the second source/drain region SD2. For example, the semiconductor pattern CSP may be in contact with the recessed top surface of the second source/drain region SD2. In an embodiment of the present inventive concept, a top surface of the semiconductor pattern CSP may be lower than the top surface of the substrate 100 (i.e., the top surface of the active pattern ACT). In an embodiment of the present inventive concept, the top surface of the semiconductor pattern CSP may be higher than the top surface of the substrate 100 and may be lower than a top surface of the insulating layer IL. The semiconductor pattern CSP may include a doped semiconductor material (e.g., doped silicon (Si), doped germanium (Ge), etc.).

The interface layer OCL may directly cover the top surface of the semiconductor pattern CSP. The interface layer OCL may form an ohmic contact between the metal contact MCT and the semiconductor pattern CSP. For example, in an embodiment of the present inventive concept, the interface layer OCL may include graphene. For example, the interface layer OCL may include a metal-semiconductor compound. The interface layer OCL may have a thickness greater than 0 nm and less than about 200 nm. For example, the interface layer OCL may have a thickness in a range from about 1 nm to about 5 nm.

The metal contact MCT may include a first metal pattern BOP and a second metal pattern BAP surrounding a surface of the first metal pattern BOP. The metal contact MCT may include an upper portion UPP extending from the interface layer OCL in the fourth direction D4, and a pad portion PAP on the upper portion UPP. The data storage element DS may be placed on the pad portion PAP.

According to the semiconductor memory device of the present inventive concept, the metal contact may be connected directly to the active pattern by using the interface layer capable of forming the ohmic contact. Thus, the contact having a relatively low resistance may be realized or formed. The resistance of the contact may be reduced, and thus electrical characteristics of the device may be enhanced. Since the contact has the relatively low resistance, the size of the contact can be reduced, and thus the device may be highly integrated.

While the present inventive concept have been described with reference to example embodiments, it will be apparent to those skilled in the art that various changes and modifications may be made without departing from the spirit and scope of the present inventive concept. Therefore, it should be understood that the above embodiments are not limiting, but illustrative. Thus, the scopes of the present inventive concept are to be determined by the broadest permissible interpretation of the following claims and their equivalents, and shall not be restricted or limited by the foregoing description.

What is claimed is:

1. A semiconductor memory device comprising:
a substrate having a first active pattern including a first source/drain region and a second source/drain region;
a gate electrode intersecting the first active pattern and extending in a first direction;
a bit line intersecting the first active pattern and extending in a second direction crossing the first direction, the bit line electrically connected to the first source/drain region;
a spacer disposed on a sidewall of the bit line;
a contact electrically connected to the second source/drain region, the contact spaced apart from the bit line with the spacer interposed therebetween with a portion of the contact vertically overlapping the bit line;
an interface layer disposed between the second source/drain region and the contact, the interface layer forming an ohmic contact between the second source/drain region and the contact; and
a data storage element disposed on the contact,
wherein a bottom of the contact, which is in contact with the interface layer, is lower than a top surface of the substrate, and
wherein the contact is formed of at least one of a metal, a conductive metal nitride, or a combination thereof.

2. The semiconductor memory device of claim 1, wherein the contact comprises:
a first metal pattern; and
a second metal pattern disposed between the first metal pattern and the interface layer,
wherein the first metal pattern includes a metal, and
wherein the second metal pattern includes a conductive metal nitride.

3. The semiconductor memory device of claim 2, wherein a bottom of the first metal pattern is lower than the top surface of the substrate.

4. The semiconductor memory device of claim 1, wherein the interface layer includes graphene, and
wherein a thickness of the interface layer ranges from about 1 nm to about 5 nm.

5. The semiconductor memory device of claim 1, wherein the contact includes:
a lower portion located at a level lower than the top surface of the substrate;
an upper portion provided on the lower portion and vertically extending along the spacer; and
a pad portion which is provided on the upper portion and on which the data storage element is placed.

6. The semiconductor memory device of claim 1, further comprising:
a device isolation layer filling a first trench defining the first active pattern,
wherein the first active pattern and the device isolation layer are recessed to define a contact hole, and
wherein a lower portion of the contact and the interface layer are provided in the contact hole.

7. The semiconductor memory device of claim 6, wherein the substrate further has a second active pattern,
wherein each of the first and second active patterns has a long axis in a third direction crossing the first and second directions,
wherein the first and second active patterns are adjacent to each other in the third direction,
wherein the device isolation layer fills a second trench between the first and second active patterns, and
wherein the second trench is deeper than the first trench.

8. The semiconductor memory device of claim 1, further comprising:
a conductive pattern provided under the bit line,
wherein the conductive pattern is connected to the first source/drain region of the first active pattern, and
wherein a bottom surface of the conductive pattern, which is in contact with the first source/drain region, is lower than the bottom of the contact.

9. The semiconductor memory device of claim 1, wherein the data storage element comprises:
a first electrode provided on a pad portion of the contact;
a second electrode disposed on the first electrode; and
a dielectric layer disposed between the first electrode and the second electrode.

10. The semiconductor memory device of claim 1, further comprising:
a mask pattern disposed on the bit line,
wherein the interface layer vertically extends from the second source/drain region along the spacer to cover at least a portion of a top surface of the mask pattern.

11. A semiconductor memory device comprising:
a substrate having an active pattern including a first source/drain region and a second source/drain region;
a gate electrode intersecting the active pattern and extending in a first direction;
a line structure intersecting the active pattern and extending in a second direction crossing the first direction, the line structure comprising a bit line electrically connected to the first source/drain region;
a spacer disposed on a sidewall of the line structure;
a metal contact electrically connected to the second source/drain region, the metal contact spaced apart from the bit line with the spacer interposed therebetween;
an interface layer disposed between the second source/drain region and the metal contact; and
a data storage element disposed on the metal contact,
wherein the interface layer includes graphene.

12. The semiconductor memory device of claim 11, wherein the second source/drain region has a top surface recessed to be lower than a top surface of the substrate, and
wherein the interface layer covers the recessed top surface of the second source/drain region.

13. The semiconductor memory device of claim 11, further comprising:
a semiconductor pattern disposed between the second source/drain region and the interface layer,
wherein the second source/drain region has a top surface recessed to be lower than a top surface of the substrate, and
wherein the semiconductor pattern is in contact with the recessed top surface of the second source/drain region.

14. The semiconductor memory device of claim 11, wherein the line structure further comprises a mask pattern on the bit line, and
wherein the interface layer vertically extends from the second source/drain region along the spacer to cover at least a portion of a top surface of the mask pattern.

15. The semiconductor memory device of claim 11, wherein the metal contact includes:
- a lower portion located at a level lower than a top surface of the substrate;
- an upper portion provided on the lower portion and vertically extending along the spacer; and
- a pad portion which is provided on the upper portion and on which the data storage element is placed.

16. A semiconductor memory device comprising:
- a substrate having an active pattern, the active pattern, which has a long axis in a first direction, including a first source/drain region and a pair of second source/drain regions spaced apart from each other in the first direction with the first source/drain region interposed therebetween;
- a device isolation layer filling a first trench which is provided in the substrate to define the active pattern;
- a pair of gate electrodes intersecting the active pattern and extending in a second direction crossing the first direction, each of the pair of gate electrodes provided in a second trench between the first and second source/drain regions and having a top surface lower than a top surface of the active pattern;
- a gate dielectric layer disposed between the active pattern and each of the pair of gate electrodes;
- a gate capping layer provided on each of the pair of gate electrodes to fill the second trench;
- an insulating layer disposed on the substrate;
- a line structure intersecting the active pattern on the insulating layer and extending in a third direction crossing the first and second directions, the line structure comprising:
  - a conductive pattern penetrating the insulating layer so as to be connected to the first source/drain region;
  - a bit line disposed on the conductive pattern; and
  - a barrier pattern disposed between the bit line and the conductive pattern;
- a pair of spacers provided on both sidewalls of the line structure, respectively;
- a pair of metal contacts electrically connected to the pair of second source/drain regions, respectively, being in contact with the pair of spacers, respectively, and spaced apart from the line structure by the pair of spacers;
- a pair of interface layers disposed between the pair of second source/drain regions and the pair of metal contacts, respectively;
- first electrodes disposed on the pair of metal contacts, respectively;
- a second electrode on the first electrodes; and
- a dielectric layer disposed between the second electrode and the first electrodes,
wherein each of the pair of second source/drain regions has a recessed top surface lower than a top surface of the substrate,
wherein each of the pair of interface layers covers the recessed top surface,
wherein each of the pair of interface layers includes graphene, and
wherein each of the pair of interface layers forms an ohmic contact between each of the pair of second source/drain regions and each of the pair of metal contacts, respectively.

17. The semiconductor memory device of claim 16, wherein a bottom surface of the conductive pattern, which is in contact with the first source/drain region, is lower than a bottom of each of the pair of metal contacts.

18. The semiconductor memory device of claim 16, wherein the line structure further comprises a mask pattern on the bit line, and
wherein each of the pair of interface layers vertically extends from the recessed top surface along each of the pair of spacers, respectively, to cover at least a portion of a top surface of the mask pattern.

19. The semiconductor memory device of claim 16, wherein each of the pair of metal contacts includes:
- a lower portion located at a level lower than the top surface of the substrate;
- an upper portion provided on the lower portion and vertically extending along one of the pair of spacers; and
- a pad portion which is provided on the upper portion and on which one of the first electrodes is placed.

* * * * *